United States Patent
Shioi et al.

(10) Patent No.: US 8,513,876 B2
(45) Date of Patent: Aug. 20, 2013

(54) FLUORESCENT SUBSTANCE, METHOD FOR PRODUCING THE SAME, AND LIGHT-EMITTING DEVICE USING THE SAME

(75) Inventors: Kousuke Shioi, Tsukuba (JP); Naoto Hirosaki, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 397 days.

(21) Appl. No.: 12/600,971

(22) PCT Filed: May 1, 2008

(86) PCT No.: PCT/JP2008/058350
§ 371 (c)(1),
(2), (4) Date: Nov. 19, 2009

(87) PCT Pub. No.: WO2008/146571
PCT Pub. Date: Dec. 4, 2008

(65) Prior Publication Data
US 2010/0164367 A1    Jul. 1, 2010

(30) Foreign Application Priority Data

May 22, 2007 (JP) ................................. 2007-135477
Mar. 26, 2008 (JP) ................................. 2008-079586

(51) Int. Cl.
*H01J 1/62* (2006.01)
(52) U.S. Cl.
USPC ........................................................ 313/503
(58) Field of Classification Search
USPC ................................. 313/503–504
See application file for complete search history.

(56) References Cited

U.S. PATENT DOCUMENTS

| | | | |
|---|---|---|---|
| 6,066,861 A | 5/2000 | Höhn et al. | |
| 6,632,379 B2 * | 10/2003 | Mitomo et al. | 252/301.4 R |
| 6,657,379 B2 | 12/2003 | Ellens et al. | |
| 2003/0030368 A1 | 2/2003 | Ellens et al. | |
| 2006/0220047 A1 | 10/2006 | Nagatomi et al. | |
| 2007/0034834 A1 | 2/2007 | Liu et al. | |
| 2008/0064586 A1 | 3/2008 | Mitomo et al. | |
| 2009/0091237 A1 | 4/2009 | Hirosaki et al. | |

FOREIGN PATENT DOCUMENTS

| | | |
|---|---|---|
| EP | 1 854 864 A1 | 11/2007 |
| JP | 5-152609 A | 6/1993 |
| JP | 7-99345 A | 4/1995 |
| JP | 2900928 B2 | 4/1998 |

(Continued)

OTHER PUBLICATIONS

Office Action with a mailing date of May 28, 2013 for corresponding Japanese Application No. 2008-134399.

*Primary Examiner* — Anh Mai
*Assistant Examiner* — Brenitra M Lee
(74) *Attorney, Agent, or Firm* — Sughrue Mion, PLLC

(57) ABSTRACT

The present invention provides a fluorescent substance exhibiting higher brightness as compared to conventional fluorescent substances, a method for producing the same, and a light-emitting device using such a fluorescent substance. Specifically, the fluorescent substance comprises an α-sialon crystal structure having the same crystal structure with an α-type silicon nitride crystal, which includes at least an M(0) element (where M(0) represents one or two elements selected from Sr and La), an M(1) element (where M(1) represents one or more elements selected from Mn, Ce, Pr, Nd, Sm, Eu, Tb, Dy, Ho, Er, Tm and Yb), Si, Al, and nitrogen.

13 Claims, 9 Drawing Sheets

(56) References Cited

FOREIGN PATENT DOCUMENTS

| | | |
|---|---|---|
| JP | 2927279 B2 | 9/1998 |
| JP | 3364229 B2 | 10/2002 |
| JP | 2002-363554 A | 12/2002 |
| JP | 2003-124527 A | 4/2003 |
| JP | 2004-067837 A | 3/2004 |
| JP | 2004-238506 A | 8/2004 |
| JP | 2006-137902 A | 6/2006 |
| JP | 2006-265506 A | 10/2006 |
| JP | 2006-321921 A | 11/2006 |
| JP | 2007-180483 A | 7/2007 |
| KR | 100900282 B1 | 5/2009 |
| WO | 2006/033418 A1 | 3/2006 |
| WO | 2006/097410 A1 | 9/2006 |
| WO | 2006/106883 A1 | 10/2006 |
| WO | 2007/004493 A1 | 1/2007 |

* cited by examiner

FLUORESCENT SUBSTANCE, METHOD FOR PRODUCING THE SAME, AND LIGHT-EMITTING DEVICE USING THE SAME

TECHNICAL FIELD

The present invention relates to a fluorescent substance which mainly consists of an inorganic compound, and the application thereof. More specifically, the application is associated with light-emitting devices such as illumination devices and display devices which use a characteristic of the fluorescent substance, that is, a property of emitting fluorescence having a long wavelength of 550 nm or longer.

Priority is claimed on Japanese Patent Application No. 2007-135477, filed May 22, 2007, and Japanese Patent Application No. 2008-079586, filed Mar. 26, 2008, the contents of which are incorporated herein by reference.

BACKGROUND ART

Fluorescent substances are applied to a vacuum fluorescent display (VFD), a field emission display (FED), a plasma display panel (PDP), a cathode ray tube (CRT), a white light-emitting diode (LED), and the like. In any application of these, in order to emit light from a fluorescent substance, energy for exciting the fluorescent substance has to be given to the fluorescent substance. The fluorescent substance emits visible light by being excited with a high energy excitation source such as vacuum ultraviolet rays, ultraviolet rays, electron beams, and blue light.

However, fluorescent substances have a problem in that, as a result of exposure to the above-mentioned excitation source, the brightness of the fluorescent substances is lowered. Therefore, there is a demand for a fluorescent substance whose brightness will not be lowered. For this reason, sialon fluorescent substances have been proposed as fluorescent substances whose brightness is less lowered, for substituting for conventional fluorescent substances such as silicate fluorescent substances, phosphate fluorescent substances, aluminate fluorescent substances, and sulfide fluorescent substances.

Such a sialon fluorescent substance is produced by a production process as schematically described below.

First, silicon nitride ($Si_3N_4$), aluminum nitride (AlN), calcium carbonate ($CaCO_3$), and europium oxide ($Eu_2O_3$) are mixed at a predetermined mole ratio. Then, the mixture is held at a temperature of 1700° C. in a nitrogen atmosphere of 1 atm (0.1 MPa) for 1 hour, and calcined by means of a hot press method (see Patent Document 1, for example). It has been reported that the α-sialon in which Eu ion is solid-dissolved, obtained by this process, serves as a fluorescent substance which emits yellow light of 550 to 600 nm by being excited with blue light of 450 to 500 nm, and can be suitably used for the application to a white LED which is produced by a combination of a blue LED and a fluorescent substance. However, there is still a demand for a fluorescent substance which exhibits much higher brightness.

On the other hand, separately from the Ca-containing sialon fluorescent substance described in Patent Document 1, Sr-containing sialon fluorescent substances have also been reported (see Patent Documents 2 and 3).

Of these, Patent Document 2 discloses a sialon fluorescent substance comprising Ca, either alone or in combination with at least Sr or Mg, in which, particularly, the proportion of Sr and/or Mg relative to Ca is preferably 40 mole % at most. It is also described that a sialon fluorescent substance comprising Sr alone serves as a blue-green light-emitting fluorescent substance having an emission peak wavelength of 512 nm.

Patent Document 3 discloses a sialon fluorescent substance which comprises Ca and Sr and has a peak emission wavelength within the range of 600 to 650 nm.

As for the prior arts of illumination devices, white light-emitting diodes made by a combination of a blue light-emitting diode element and a yellow light-emitting fluorescent substance which has a blue light absorption property are known and placed to practical use for the application to a variety of illuminations. Representative examples thereof can include "Light-emitting diode" of Japanese Patent No. 2900928 (Patent Document 4), "Light-emitting diode" of Japanese Patent No. 2927279 (Patent Document 5), and "Wavelength-converting casting material and its manufacturing method and light-emitting device" of Japanese Patent No. 3364229 (Patent Document 6).

In these light-emitting diodes, fluorescent substances particularly used are cerium-activated yttrium/aluminum/garnet based fluorescent substances represented by a general formula $(Y, Gd)_3(Al, Ga)_5O_{12}:Ce^{3+}$.

Such illumination devices can be produced by a publicly known method such as those described in Patent Document 7 and Patent Document 8.

Patent Document 1: Japanese Unexamined Patent Application, First Publication No. 2002-363554
Patent Document 2: Japanese Unexamined Patent Application, First Publication No. 2003-124527
Patent Document 3: Japanese Unexamined Patent Application, First Publication No. 2006-137902
Patent Document 4: Japanese Patent No. 2900928
Patent Document 5: Japanese Patent No. 2927279
Patent Document 6: Japanese Patent No. 3364229
Patent Document 7: Japanese Unexamined Patent Application, First Publication No. H5-152609
Patent Document 8: Japanese Unexamined Patent Application, First Publication No. H7-99345

DISCLOSURE OF INVENTION

However, the fluorescent substance described in Patent Document 2 is not sufficient in the emission intensity since the proportion of Sr and/or Mg relative to Ca is within a range of 40 mole % at most. In addition, the fluorescent substance comprising Sr alone described in this document serves as a blue-green light-emitting fluorescent substance having an emission peak wavelength of 512 nm, and thus is not able to yield white light when combined with a blue LED.

In addition, the fluorescent substance described in Patent Document 3 has a peak emission wavelength within the range of 600 to 650 nm, and thus is not able to yield white light having a high color temperature when combined with a blue LED to serve as a white LED.

Moreover, regarding the light-emitting devices such as illumination, a white light-emitting diode comprising a blue light-emitting diode element and an yttrium/aluminum/garnet based fluorescent substance had a characteristic of emitting bluish-white light due to a lack of a red component, and thus raised a problem of uneven color-rendering property.

The present invention has been developed in light of the problems described above, and has an object of providing a fluorescent substance exhibiting higher brightness as compared to conventional fluorescent substances, a method for producing the same, and a light-emitting device using the same.

As a result of intensive research aimed at achieving the above object, the inventors of the present invention discovered that a fluorescent substance comprising a crystal having the same crystal structure with an α-type silicon nitride crystal, or an α-sialon crystal, which includes at least an M(0) element (where M(0) represents one or two elements selected from Sr and La), an M(1) element (where M(1) represents one or more elements selected from Mn, Ce, Pr, Nd, Sm, Eu, Tb, Dy, Ho, Er, Tm, and Yb), Si, Al, and nitrogen, a fluorescent substance further comprising oxygen, or a fluorescent substance further comprising an M(2) element (where M(2) represents one or more elements selected from Li, Na, Be, Mg, Ca, Ba, Sc, Y, Gd, and Lu), emits light having higher brightness as compared to conventional sialon fluorescent substances.

As a result of further research on this finding, the inventors were able to complete the present invention shown below.

[1] A fluorescent substance comprising an α-sialon crystal structure having the same crystal structure with an α-type silicon nitride crystal, which includes at least an M(0) element (where M(0) represents one or two elements selected from Sr and La), an M(1) element (where M(1) represents one or more elements selected from Mn, Ce, Pr, Nd, Sm, Eu, Tb, Dy, Ho, Er, Tm, and Yb), Si, Al, and nitrogen.

[2] The fluorescent substance according to [1], further including oxygen.

[3] The fluorescent substance according to [1] or [2], further including an M(2) element (where M(2) represents one or more elements selected from Li, Na, Be, Mg, Ca, Ba, Sc, Y, Gd, and Lu).

[4] The fluorescent substance according to [1] to [3], wherein said fluorescent substance comprises a composition represented by the following composition formula:

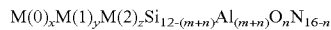

$M(0)_x M(1)_y M(2)_z Si_{12-(m+n)} Al_{(m+n)} O_n N_{16-n}$ where x, y, and z representing the composition ratio satisfy the inequations of $0.01 \leq x \leq 4$, $0.001 < y \leq 2$, and $0 \leq z \leq 2$, and m and n representing the composition ratio satisfy the inequations of $0.8 \cdot me \leq m \leq 1.2 \cdot me$ and $0 \leq n < 4$ provided that $me = x \cdot v(0) + y \cdot v(1) + z \cdot v(2)$ (where v(0) represents a valence of the M(0) ion, v(1) represents a valence of the M(1) ion, and v(2) represents a valence of the M(2) ion).

[5] A fluorescent substance comprising an α-sialon crystal structure having the same crystal structure with an α-type silicon nitride crystal, which includes at least an M(0) element (where M(0) represents one or two elements selected from Sr and La), an M(1) element (where M(1) represents one or more elements selected from Mn, Ce, Pr, Nd, Sm, Eu, Tb, Dy, Ho, Er, Tm, and Yb), Si, Al, and nitrogen, wherein the fluorescent substance comprises an α-sialon powder, and an amount of oxygen included in the α-sialon powder is larger than the value calculated on the basis of the following composition formula, by a difference within the range of 0.4 mass % or less:

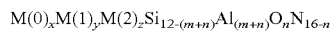

$M(0)_x M(1)_y M(2)_z Si_{12-(m+n)} Al_{(m+n)} O_n N_{16-n}$ where x, y, and z representing the composition ratio satisfy the inequations of $0.01 \leq x \leq 4$, $0.001 < y \leq 2$, and $0 \leq z \leq 2$, and m and n representing the composition ratio satisfy the inequations of $0.8 \cdot me \leq m \leq 1.2 \cdot me$ and $0 \leq n < 4$ provided that $me = x \cdot v(0) + y \cdot v(1) + z \cdot v(2)$ (where v(0) represents a valence of the M(0) ion, v(1) represents a valence of the M(1) ion, and v(2) represents a valence of the M(2) ion).

[6] The fluorescent substance according to [4] or [5], wherein x satisfies the inequation of $0.05 \leq x \leq 2$.

[7] The fluorescent substance according to [4] or [5], wherein y satisfies the inequation of $0.001 \leq y \leq 1.2$.

[8] The fluorescent substance according to [4] or [5], wherein n satisfies the inequation of $0 \leq n \leq 1.5$.

[9] The fluorescent substance according to [4] or [5], wherein n and m satisfy the equation of $n = me$.

[10] The fluorescent substance according to [1] to [9], wherein the content of the α-sialon is 90 mass % or more, and the remainder consists of one selected from β-sialon, unreacted silicon nitride, oxynitride glass, and $SrSi_6N_8$, when measured by powder X-ray diffractometry using Cu—Kα radiation.

[11] The fluorescent substance according to [1] to [10], wherein said fluorescent substance is a powder having an average particle diameter within the range of 0.1 μm to 50 μm.

[12] The fluorescent substance according to [11], wherein the average aspect ratio of primary particles constituting said fluorescent substance is 3 or less.

[13] The fluorescent substance according to [1] to [12], wherein said fluorescent substance includes 5 to 300 ppm of fluorine.

[14] The fluorescent substance according to [1] to [13], wherein said fluorescent substance includes 10 to 3000 ppm of boron.

[15] A method for producing a fluorescent substance comprising an α-sialon crystal having the same crystal structure with an α-type silicon nitride crystal, which includes at least an M(0) element (where M(0) represents one or two elements selected from Sr and La), an M(1) element (where M(1) represents one or more elements selected from Mn, Ce, Pr, Nd, Sm, Eu, Tb, Dy, Ho, Er, Tm, and Yb), Si, Al, and nitrogen, wherein one or more raw materials selected from $MSiN_2$, $M_2Si_5N_8$, $M_3Al_2N_4$, and $MSi_6N_8$ are at least used as a starting material, in the form of an M-containing compound (where M represents one or more elements selected from divalent elements in the element group consisting of Sr and M(1)).

[16] A method for producing a fluorescent substance comprising an α-sialon crystal structure having the same crystal structure with an α-type silicon nitride crystal, which includes at least Sr, an M(1) element (where M(1) represents one or more elements selected from Mn, Ce, Pr, Nd, Sm, Eu, Tb, Dy, Ho, Er, Tm, and Yb), Si, Al, and nitrogen, wherein the method comprises a process of preparing one or more raw materials selected from $MSiN_2$, $M_2Si_5N_8$, $M_3Al_2N_4$, and $MSi_6N_8$ as a starting material, in the form of an M-containing compound (where M represents one or more elements selected from divalent elements in the element group consisting of Sr and M(1)); a process of kneading the raw materials to yield a raw material mixture; a process of forming a compact of the raw material mixture; a process of calcinating the compact; and a process of heat-treating the calcinated compact.

[17] The method for producing a fluorescent substance according to [15] or [16], wherein oxygen is further included.

[18] The method for producing a fluorescent substance according to [15] or [16], wherein $LiSi_2N_3$ is used as a starting material in the form of an Li-containing compound, for further including an M(2) element (where M(2) represents one or more elements selected from Li, Na, Be, Mg, Ca, Ba, Sc, Y, Gd, and Lu).

[19] The method for producing a fluorescent substance according to [16] to [18], wherein a fluorescent substance powder having a target composition previously synthesized as a seed, is added to said raw material mixture.

[20] The method for producing a fluorescent substance according to [16] to [19], wherein the method further comprises a process of grinding the calcinated agglomerate of said fluorescent substance by using a grinder made of a grinding medium or a lining material comprising alumina, silicon nitride, or α-sialon, until the average particle diameter reaches 20 μm or smaller.

[21] The method for producing a fluorescent substance according to [16] to [20], wherein the method further comprises a granulating process of spray-drying said raw material mixture, thereby adjusting the particle diameter of the aggregate of the raw material powder.

[22] The method for producing a fluorescent substance according to [16] to [21], wherein the raw material powder is kneaded by wet milling with a solvent in said kneading process.

[23] The method for producing a fluorescent substance according to [16] to [22], wherein said calcination process is performed in a nitrogen atmosphere having a pressure of 0.1 MPa to 100 MPa, within a temperature range of 1500° C. to 2200° C.

[24] The method for producing a fluorescent substance according to [16] to [23], wherein said calcination process is performed with the coexistence of carbon or a carbon-containing compound.

[25] The method for producing a fluorescent substance according to [16] to [24], wherein said calcination process is performed in a state where the filling rate is kept at a bulk density of 40% or less.

[26] The method for producing a fluorescent substance according to [16] to [25], wherein said calcination process is performed in a state where the filling rate is kept at 20 volume % or more, in terms of a ratio of the bulk volume of the raw material mixture to the volume of a container in use.

[27] The method for producing a fluorescent substance according to [26], wherein the aggregate powder is calcinated in the container in said calcination process.

[28] The method for producing a fluorescent substance according to [16] to [27], wherein said heat-treatment process is performed in an atmosphere of one or more components selected from nitrogen, ammonia, and hydrogen, at a temperature of 600° C. to 2200° C.

[29] A fluorescent substance comprising a transparent layer in a thickness of (10 to 180)/n (unit: nanometer) on at least a part of the surfaces of α-sialon particles constituting the fluorescent substance according to [1] to [14], provided that n represents a refractive index of the transparent layer within the range of 1.2 to 2.5.

[30] The fluorescent substance according to [29], wherein the refractive index of said transparent layer is within the range of 1.5 to 2.0.

[31] A method for producing a fluorescent substance, wherein the method comprises: suspending a fluorescent substance comprising an α-sialon crystal structure having the same crystal structure with an α-type silicon nitride crystal, which includes at least an M(0) element (where M(0) represents one or two elements selected from Sr and La), an M(1) element (where M(1) represents one or more elements selected from Mn, Ce, Pr, Nd, Sm, Eu, Tb, Dy, Ho, Er, Tm, and Yb), Si, Al, and nitrogen, in an organic solvent; and adding an organometallic complex or metalalkoxide dropwise thereto, to thereby form a transparent layer in a thickness of (10 to 180)/n (unit: nanometer) on at least a part of the surfaces of α-sialon particles, provided that n represents a refractive index of the transparent layer within the range of 1.2 to 2.5

[32] A method for producing a fluorescent substance, wherein the method comprises; suspending a fluorescent substance comprising an α-sialon crystal structure having the same crystal structure with an α-type silicon nitride crystal, which includes at least an M(0) element (where M(0) represents one or two elements selected from Sr and La), an M(1) element (where M(1) represents one or more elements selected from Mn, Ce, Pr, Nd, Sm, Eu, Tb, Dy, Ho, Er, Tm, and Yb), Si, Al, and nitrogen, in water; and adding a metal salt aqueous solution dropwise thereto while keeping a constant pH, to thereby form a transparent layer in a thickness of (10 to 180)/n (unit: nanometer) on at least a part of the surfaces of α-sialon particles, provided that n represents a refractive index of the transparent layer within the range of 1.2 to 2.5.

[33] A light-emitting device comprising a light emitting light source and a fluorescent substance, wherein the fluorescent substance according to any one of [1] to [14], [29] and [30] is used.

[34] A light-emitting device comprising a light emitting light source and a fluorescent substance, wherein the fluorescent substance according to any one of [1] to [14], [29] and [30], and $CaAlSiN_3$:Eu are used.

[35] The light-emitting device according to [33] or [34], wherein said light emitting light source is any one of an LED, an inorganic EL, and an organic EL which emits light having a wavelength of 330 to 500 nm.

[36] A light-emitting device comprising the fluorescent substance according to any one of [1] to [14], [29] and [30], and an LED whose maximum intensity of emission wavelength is within the range of 330 to 500 nm, as components.

EFFECTS OF THE INVENTION

According to the fluorescent substance of the present invention, sufficiently high emission intensity can be obtained by a fluorescent substance comprising a crystal having the same crystal structure with an α-type silicon nitride crystal, or an α-sialon crystal, which includes at least an M(0) element (where M(0) represents one or two elements selected from Sr and La), an M(1) element (where M(1) represents one or more elements selected from Mn, Ce, Pr, Nd, Sm, Eu, Tb, Dy, Ho, Er, Tm, and Yb), Si, Al, and nitrogen; a fluorescent substance further including oxygen; or a fluorescent substance further including an M(2) element (where M(2) represents one or more elements selected from Li, Na, Be, Mg, Ca, Ba, Sc, Y, Gd, and Lu).

Moreover, the fluorescent substance of the present invention is also an α-sialon-based fluorescent substance comprising an α-sialon phase and the remainder which includes one or more materials selected from β-sialon, unreacted silicon nitride, oxynitride glass, and $SrSi_6N_8$. When one or more materials selected from β-sialon, unreacted silicon nitride, oxynitride glass, and $SrSi_6N_8$ are included in addition to the α-sialon phase, sufficiently high emission intensity can be obtained if the content of the α-sialon phase is 90 mass % or more.

In addition, when the fluorescent substance of the present invention is a powder having an average particle diameter of 0.1 μm to 50 μm, influences of surface defects can be avoided, the excitation light can be sufficiently absorbed, and the light emission having high intensity can be obtained.

According to the fluorescent substance of the present invention, when the average aspect ratio of primary particles constituting the α-sialon powder is 3 or less, not only the dispersibility in a resin is improved, but also the excitation light can be effectively absorbed and sufficiently high emission intensity can be obtained.

Furthermore, when a trace amount of impurity such as fluorine and boron is included in the fluorescent substance of the present invention, the emission intensity is further improved.

In addition, in a method for producing a fluorescent substance comprising a crystal having the same crystal structure with an α-type silicon nitride crystal, or an α-sialon crystal, which includes at least Sr, an M(1) element (where M(1) represents one or more elements selected from Mn, Ce, Pr, Nd, Sm, Eu, Tb, Dy, Ho, Er, Tm, and Yb), Si, Al, and nitrogen; a fluorescent substance further including oxygen; or a fluorescent substance further including an M(2) element (where M(2) represents one or more elements selected from Li, Na, Be, Mg, Ca, Ba, Sc, Y, Gd, and Lu), one or more materials selected from $MSiN_2$, $M_2Si_5N_8$, $M_3Al_2N_4$, and $MSi_6N_8$ can be used as an M-containing compound (where M represents one or more elements selected from divalent elements in the element group consisting of Sr and M(1)), and $LiSi_2N_3$ can be used as an Li-containing compound. By using these compounds, the reactivity in the calcination process can be improved, and the fluorescent substance having higher brightness can be obtained.

Moreover, according to the method for producing a fluorescent substance of the present invention, when the raw material mixture is a mixture made by adding a target fluorescent substance powder that has been previously synthesized as a seed, the synthesis reaction is promoted so that synthesis at a low temperature becomes possible. In addition, the fluorescent substance having higher crystallinity can be obtained, and therefore the emission intensity is improved.

Here, the raw material compound may also be mixed with a flux if necessary. As to the flux, an alkali metal halide or an alkaline earth metal halide can be used. For example, the flux is added within the range of 0.01 to 20 parts by mass relative to 100 parts by mass of the fluorescent substance raw material.

An aggregate of the raw material powder mixture can be obtained through the kneading process in which a raw material powder is kneaded by wet milling with a solvent, and the granulating process in which the kneaded product obtained from the kneading process is spray-dried by a spray-dryer so as to thereby adjust the particle diameter of the aggregate of the raw material powder. In addition, as a method for setting the aggregate of the raw material powder mixture in a state where the filling rate is kept at a bulk density of 40% or less, a method can be employed in which the aggregate powder that has been granulated in the granulating process is calcinated in a container.

In the calcination of the fluorescent substance of the present invention, the raw material mixture is treated in a nitrogen atmosphere having a pressure of 0.1 MPa to 100 MPa, within a temperature range of 1500° C. to 2200° C. By having this calcination condition, neither volatilization of the raw material compound nor unevenness in the composition occur because of a sufficient pressure, the time efficiency is excellent because of a sufficient temperature, the raw material will not be melted, and the fluorescent substance having high emission intensity can be obtained.

Moreover, according to the method for producing a fluorescent substance of the present invention, when the raw material mixture is calcinated with the coexistence of carbon or a carbon-containing compound, the raw material mixture is contacted with a reducing atmosphere. Therefore, particularly, if a raw material compound having a high oxygen content is used, the fluorescent substance having high brightness can be obtained.

In the calcination method for the fluorescent substance of the present invention, the raw material powder mixture is calcinated in a state where the filling rate is kept at a bulk density of 40% or less. This method satisfies requirements for both economy and quality.

Furthermore, according to the method for producing a fluorescent substance of the present invention, the raw material mixture is calcinated in a state where the filling rate is kept at 20 volume % or more, in terms of a ratio of the bulk volume of the raw material mixture to the volume of a container in use. According to this method, the fluorescent substance having high brightness can be obtained.

The calcined agglomerate including the α-sialon-based fluorescent substance obtained by the above-mentioned calcination condition is subjected to the grinding process by using a grinder made of a grinding medium or a lining material comprising alumina, silicon nitride, or α-sialon, until the average particle diameter reaches 20 μm or smaller, and the process of heat-treating the ground powder in an atmosphere of one or more components selected from nitrogen, ammonia, and hydrogen, at a temperature of 600° C. to 2200° C. When a grinder made of a grinding medium or a lining material comprising alumina, silicon nitride, or α-sialon is used, contamination by impurities can be prevented in the grinding process. Moreover, by heat-treating the ground powder in an atmosphere of one or more components selected from nitrogen, ammonia, and hydrogen, at a temperature of 600° C. to 2200° C., defects introduced in the grinding process can be reduced and the emission intensity can be recovered.

The fluorescent substance of the present invention is a fluorescent substance comprising a crystal having the same crystal structure with an α-type silicon nitride crystal, or an α-sialon crystal, which includes at least an M(0) element (where M(0) represents one or two elements selected from Sr and La), an M(1) element (where M(1) represents one or more elements selected from Mn, Ce, Pr, Nd, Sm, Eu, Tb, Dy, Ho, Er, Tm, and Yb), Si, Al, and nitrogen; a fluorescent substance further including oxygen; or a fluorescent substance further including an M(2) element (where M(2) represents one or more elements selected from Li, Na, Be, Mg, Ca, Ba, Sc, Y, Gd, and Lu); as well as being a fluorescent substance wherein an amount of oxygen included in the α-sialon powder is larger than the value calculated on the basis of the above-mentioned composition formula, by a difference of 0.4 mass % or less. Here, the oxygen whose amount is larger by a difference of 0.4 mass % or less forms a transparent layer on at least a part of the surfaces of particles of the α-sialon powder.

The thickness of the transparent layer formed on at least a part of the surfaces of the particles of the α-sialon powder is (10 to 180)/n (unit: nanometer), provided that n represents a refractive index of the transparent layer within the range of 1.2 to 2.5, and preferably 1.2 to 2.0. By forming the transparent layer on at least a part of the surfaces of particles of the α-sialon powder, the oxidation resistance of particles of the α-sialon powder is improved, and the difference in the refractive index between the particles and the sealing resin is reduced, so that the loss of light in the interface between the fluorescent substance and the sealing resin can be reduced.

A method for forming the transparent layer on at least a part of the surfaces of the particles of the α-sialon powder includes a method in which an α-sialon-based fluorescent substance is suspended in an organic solvent and an organometallic complex or metalalkoxide is added dropwise thereto, and a method in which an α-sialon-based fluorescent substance is suspended in water, and a metal salt aqueous solution is added dropwise thereto while keeping a constant pH.

According to the light-emitting device of the present invention, by using a light-emitting device comprising a light emitting light source and a fluorescent substance which uses at least the fluorescent substance of the present invention, the light-emitting device having sufficiently high brightness and color-rendering properties can be obtained.

In addition, in the light-emitting device of the present invention, when the light emitting light source is any one of an LED, an inorganic EL, and an organic EL which emit light having a wavelength of 330 to 500 nm, the light-emitting device becomes capable of exciting the fluorescent substance of the present invention, and the light-emitting device having higher brightness and color-rendering properties can be obtained.

Moreover, by using the fluorescent substance of the present invention and $CaAlSiN_3$:Eu, the light-emitting device of the present invention comprising a light emitting light source and a fluorescent substance and emitting light from warm white having a strong red component to orange can be obtained.

BRIEF DESCRIPTION OF THE REFERENCE SYMBOLS

Figure 1:
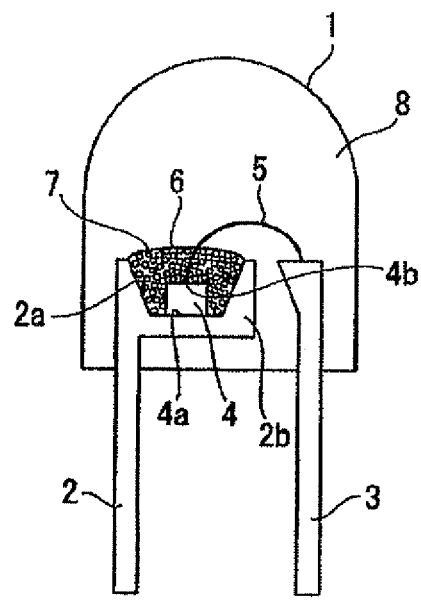
FIG. 1 is a cross-sectional view of a light-emitting device (LED illuminator) in a first embodiment of the present invention.

1. Shell-type light-emitting diode lamp, 2. First lead wire, 3. Second lead wire, 4. Blue light-emitting diode element, 5. Bonding wire (Thin metal wire), 6. First resin, 7. Fluorescent substance, 8. Second resin, 11. Surface-mount chip-type white light-emitting diode lamp, 12. Third lead wire, 13. Fourth lead wire, 14. Blue light-emitting diode element, 15. Bonding wire (Thin metal wire), 16. Third resin, 17. Fluorescent substance, 18. Fourth resin, 19. Alumina ceramic substrate, 20. Side face member

BEST MODE FOR CARRYING OUT THE INVENTION

A detailed description of embodiments of the present invention is presented below.

<Fluorescent Substance>

The fluorescent substance of the present invention is a fluorescent substance comprising a crystal having the same crystal structure with an α-type silicon nitride crystal, or an α-sialon crystal, which includes at least an M(0) element (where M(0) represents one or two elements selected from Sr and La), an M(1) element (where M(1) represents one or more elements selected from Mn, Ce, Pr, Nd, Sm, Eu, Tb, Dy, Ho, Er, Tm, and Yb), Si, Al, and nitrogen; a fluorescent substance further including oxygen; or a fluorescent substance further including an M(2) element (where M(2) represents one or more elements selected from Li, Na, Be, Mg, Ca, Ba, Sc, Y, Gd, and Lu).

When the fluorescent substance of the present invention is composed of a mixture of the fluorescent substance composition according to [1] mentioned above and another crystal phase or an amorphous phase of β-sialon, unreacted silicon nitride, oxynitride glass, $SrSi_6N_8$, and the like, the content of the fluorescent substance composition of [1] is preferably 90 mass % or more. It is not preferable if the content of the fluorescent substance composition of [1] is less than 90 mass %, since sufficiently high emission intensity can not be obtained.

In addition, the fluorescent substance of the present invention is preferably represented by the composition formula [4] or [5] mentioned above.

It is not preferable if the values of x, y, z, m, and n are out of the range described in [4] or [5], since the emission intensity is lowered.

The m value satisfies the relation of $m=v(0) \cdot x+v(1) \cdot y+v(2) \cdot z$ provided that v(0) represents a valence of the M(0) element, v(1) represents a valence of the M(1) element, and v(2) represents a valence of the M(2) element.

In the present invention, the n value satisfies the inequation of $0 \leq n<4$, and is preferably within a range of $0 \leq n<0.5 \cdot v(0) \cdot x+0.5 \cdot v(1) \cdot y+0.5 \cdot v(2) \cdot z$ provided that v(0) represents a valence of the M(0) element, v(1) represents a valence of the M(1) element, and v(2) represents a valence of the M(2) element. The reason is that, if the n value is smaller than $0.5 \cdot v(0) \cdot x+0.5 \cdot v(1) \cdot y+0.5 \cdot v(2) \cdot z$, the α-sialon phase is more stabilized, the content of the α-sialon phase increases, and the emission intensity is improved. On the other hand, if the n value is greater than $0.5 \cdot v(0) \cdot x+0.5 \cdot v(1) \cdot y+0.5 \cdot v(2) \cdot z$, the content of the β-sialon phase or unreacted silicon nitride increases and the emission intensity is prone to decrease.

The ratio of z to x is preferably within a range of $0 \leq z/x \leq 2/3$ when M(2) is Ca. It is not preferable if the z/x value is greater than 2/3, since the emission intensity is lowered.

A more preferable range of the ratio of z to x is $0 \leq z/x \leq 0.5$. If it is within this range, sufficiently high emission intensity can be obtained.

A preferable range of the y value is $0.001<y \leq 1.2$, and $0.001<y/(x+y+z) \leq 0.3$ in terms of the proportion including x and z values. If the y value is within this range, high emission intensity can be obtained. A more preferable range of the y value is $0.001<y/(x+y+z) \leq 0.2$. If the y value is within this range, higher emission intensity can be obtained. If the y value is smaller than 0.001, sufficient emission intensity can not be obtained since the number of light-emitting atoms is too small. In addition, if the y value is greater than 0.3, the emission intensity is lowered because of concentration quenching. Thus, these cases are both not preferable.

For the M(1) element, it is possible to use one or more elements selected from Mn, Ce, Pr, Nd, Sm, Eu, Tb, Dy, Ho, Er, Tm, and Yb, although it is preferable to use one or more elements selected from Ce, Eu, and Yb. The fluorescent substance of the present invention exhibits white-blue luminescence when M(1) is Ce, yellow luminescence when M(1) is Eu, and green luminescence when M(1) is Yb.

The average particle diameter of the fluorescent substance of the present invention is preferably within the range of 0.1 µm to 50 µm. If the average particle diameter is smaller than 0.1 µm, influences of surface defects become noticeable and the emission intensity is lowered. If the average particle diameter is larger than 50 µm, the absorption of excitation light becomes insufficient and the light emission is lowered. Therefore, these cases are both not preferable. The particle size of the fluorescent substance can be measured by a laser diffraction scattering method.

According to the fluorescent substance of the present invention, when the average aspect ratio of primary particles constituting the α-sialon powder is 3 or less, not only the dispersibility in a resin is improved, but also the excitation light can be efficiently absorbed and sufficiently high emission intensity can be obtained. If the average aspect ratio is greater than 3, kneading into the resin becomes difficult, and voids are easily generated in the interface between the resin and the fluorescent substance particles. Moreover, if the average aspect ratio is greater than 3, particles are entangled, and the fluorescent substance particles arranged in parallel with the excitation light become insufficient in excitation light absorptivity, and hence sufficiently high emission intensity can not be obtained. Therefore, these cases are not preferable.

In the present invention, relationships between trace amounts of additive elements and the light emission characteristics were investigated, which showed that much better light emission characteristics can be obtained if 5 to 300 ppm of fluorine or 10 to 3000 ppm of boron is included. This phenomenon becomes prominent when 5 ppm or more of fluorine, or 10 ppm or more of boron is included. However, not much higher effect can be obtained any longer when the fluorine content exceeds 300 ppm, or the boron content exceeds 3000 ppm.

If the amount of oxygen included in the fluorescent substance of the present invention is larger than the value calculated on the basis of the above-mentioned general formula, by a difference of 0.4 mass % or less, the light emission characteristics are further improved. Here, the oxygen at a larger amount by a difference of 0.4 mass % or less forms a transparent layer on at least a part of the surfaces of particles of the α-sialon powder. With this transparent layer, the oxidation resistance of the particles of the α-sialon powder is improved, and the difference in the refractive index between the particles and the sealing resin decreases, so that the loss of light in the interface between the fluorescent substance and the sealing resin can be reduced. Furthermore, unpaired electrons and defects in the surfaces of the fluorescent substance particles are reduced. Therefore, such an oxygen amount is effective for improvement in the emission intensity.

The thickness of the transparent layer formed on at least a part of the surfaces of particles of the α-sialon powder is (10 to 180)/n (unit: nanometer), provided that n represents a refractive index of the transparent layer within the range of 1.2 to 2.5, and preferably 1.5 to 2.0. If the thickness of the transparent layer is thicker than this range, the transparent layer itself absorbs light, and thus the emission intensity is lowered. If the thickness of the transparent layer is thinner than this range, it becomes difficult to form an even transparent layer, and the effect of reducing the loss of light in the interface between the fluorescent substance and the sealing resin becomes insufficient. Therefore, these cases are not preferable. Generally, an appropriate thickness of the transparent layer is defined by the refractive index of the transparent layer. If the refractive index of the transparent layer is high, the transparent layer may be made thin to achieve the purpose. If the refractive index is low, the transparent layer must be thick to achieve the purpose. Examples of suitable materials of the transparent layer of the present invention can include inorganic substances such as silica, alumina, titania, magnesia, and magnesium fluoride, and resins such as polystyrene, polycarbonate, and polymethylstyrene.

In addition, coupling treatment on the surfaces of particles of the α-sialon powder can improve the adhesiveness or the dispersibility between the resin and the fluorescent substance. Examples of usable coupling agents can include a silane coupling agent, a titanate-based coupling agent, and an aluminate-based coupling agent. The coupling treatment may also be performed after the formation of the transparent layer as required.

The refractive index of the resin for dispersing the fluorescent substance is preferably closer to the refractive index of the transparent layer because such a refractive index offers an inhibitory effect against the reflection in the interface between the transparent layer and the resin. In this case, when a resin having a lower refractive index than that of the resin which has the fluorescent substance dispersed therein is arranged outside the resin which has the fluorescent substance dispersed therein, the light emitting-element having much higher brightness can be obtained.

When the fluorescent substance of the present invention is used where it is excited with an electron beam, conductivity can be given to the fluorescent substance by mixing a conductive inorganic substance therein. Examples of the conductive inorganic substance can include an oxide, an oxynitride, or a nitride containing one or more elements selected from Zn, Al, Ga, In, and Sn, or a mixture thereof.

In the fluorescent substance of the present invention may be mixed an inorganic fluorescent substance or a fluorescent dye which exhibits a color differing from the luminescent color of the present invention, as required.

The thus obtained fluorescent substance of the present invention is characterized in having a wide excitation range including electron beams, X rays, ultraviolet rays, and visible light, as compared to conventional oxide fluorescent substances and existing sialon fluorescent substances, and is particularly characterized in exhibiting a color from yellow to orange, that is, from 560 nm to 610 nm, when Eu is used as an activator.

Because of the above-mentioned light emission characteristics, the fluorescent substance of the present invention is suitable for light-emitting equipments such as an illuminator, a display instrument, an image display device, a pigment, and an ultraviolet absorber. In addition, the fluorescent substance is not deteriorated even when exposed to a high temperature, and thus exhibits an excellent heat resistance and an excellent long-term stability under an oxidizing atmosphere and a moisture environment.

There is no restriction in the method for producing the fluorescent substance of the present invention, and a fluorescent substance having high brightness can be produced by the following method.

<Method for Producing a Fluorescent Substance>

The method for producing a fluorescent substance of the present invention is capable of providing a fluorescent substance having high emission intensity by calcinating a raw material mixture which is able to form a fluorescent substance comprising a crystal having the same crystal structure with an α-type silicon nitride crystal, or an α-sialon crystal, which includes at least an M(0) element (where M(0) represents one or two elements selected from Sr and La), an M(1) element (where M(1) represents one or more elements selected from Mn, Ce, Pr, Nd, Sm, Eu, Tb, Dy, Ho, Er, Tm, and Yb), Si, Al, and nitrogen; a fluorescent substance further including oxygen; or a fluorescent substance further including an M(2) element (where M(2) represents one or more elements selected from Li, Na, Be, Mg, Ca, Ba, Sc, Y, Gd, and Lu), in a nitrogen atmosphere having a pressure of 0.1 MPa to 100 MPa, within a temperature range of 1500° C. to 2200° C.

As for the raw material of M(1), there can be used a metal, a silicide, an oxide, a carbonate, a nitride, an oxynitride, a chloride, a fluoride, an oxyfluoride, a hydroxide, an acetate, an oxalate, a sulfate, a nitrate, or an organometallic compound, alternatively a compound or a conjugated compound capable of forming an oxide, a nitride, or an oxynitride by heating. As for M(0) or M(2), there can be used a metal, a silicide, an oxide, a carbonate, a nitride, an oxynitride, a chloride, a fluoride, an oxyfluoride, a hydroxide, an acetate, an oxalate, a sulfate, a nitrate, or an organometallic compound, alternatively a compound or a conjugated compound capable of forming an oxide, a nitride, or an oxynitride by heating. Furthermore, as for Al or Si, there can be used a metal, a silicide, an oxide, a carbonate, a nitride, an oxynitride, a chloride, a fluoride, an oxyfluoride, a hydroxide, an acetate, an oxalate, a sulfate, a nitrate, or an organometallic compound, alternatively a compound or a conjugated compound capable of forming an oxide, a nitride, or an oxynitride by heating.

Of these, preferred raw material compounds of M(1) are in the form of an oxide and a nitride, preferred raw material compounds of M(0) or M(2) are in the form of an oxide, a carbonate, a nitride, and a silicide, and preferred raw material compounds of Al or Si are in the form of a nitride, an oxide, and a silicide.

In the present invention, particularly, in order to synthesize a fluorescent substance which includes Eu as an activator by using a trivalent europium raw material, then for the trivalent europium raw material, europium nitride or europium oxide is preferably used as a starting material of the mixture. The europium oxide is reduced to be divalent in the calcination process. Moreover, generally, a nitride raw material contains oxygen which serves as a usual impurity. This kind of oxygen or oxygen contained in europium oxide serves as an impurity in the fluorescent substance or a constituent element of another crystal phase. Furthermore, when the raw material mixture is calcinated with the coexistence of carbon or a carbon-containing compound, europium oxide is strongly reduced and thereby the amount of oxygen decreases.

In the fluorescent substance of the present invention, europium exhibits excellent luminescence when it is divalent. If a trivalent europium-containing compound is used as a raw material, the compound needs to be reduced in the calcination process. Regarding the proportion of divalent europium and trivalent europium, divalent europium is preferably more abundant. The proportion of divalent europium in all types of europium is preferably 50% or more. It is more preferable to be 80% or more. It is not preferable if trivalent europium remains, since it exhibits luminescence having a wavelength differing from that of divalent europium, and thus brings about a change in the luminescent color. The proportion of divalent europium and trivalent europium can be analyzed by an X-ray absorption fine structure (XAFS) analysis method.

If necessary, a fluorescent substance powder that has been previously synthesized may be added as a seed and mixed with the raw material compound. The addition amount of the seed is within the range of 1 to 50 parts by mass relative to 100 parts by mass of the fluorescent substance raw material. By adding the seed, the synthesis reaction is promoted, so that synthesis at a low temperature becomes possible. In addition, the fluorescent substance having higher crystallinity can be obtained, and therefore the emission intensity is improved.

In addition, one or more materials selected from $MSiN_2$, $M_2Si_5N_8$, $M_3Al_2N_4$, and $MSi_6N_8$ can be used as an M-containing compound (where M represents one or more elements selected from divalent elements in the element group consisting of Sr and M(1)), and $LiSi_2N_3$ can be used as an Li-containing compound. In the M- or Li-containing fluorescent substance of the present invention, it is necessary to use a nitride or the like of M or Li, as a raw material for synthesizing a fluorescent substance having the composition in which the n value is smaller than $x+0.5 \cdot am(1) \cdot y+0.5 \cdot am(2) \cdot z$. However, such a nitride is easily oxidized in air, and thus has to be handled in an air-free glove box in the processes of weighing, mixing, and the like. Furthermore, generally, the mixed raw material is exposed to air until the mixed raw material is filled in a calcination furnace and air in the furnace is removed. Therefore, even if handled in an air-free glove box in the processes of weighing, mixing, and the like, the mixed raw material is inevitably oxidized to a certain degree. On the other hand, compounds such as $MSiN_2$, $M_2Si_5N_8$, $M_3Al_2N_4$, $MSi_6N_8$, and $LiSi_2N_3$ are stable in air, and thus there is no concern of oxidization in the processes of weighing, mixing, and the like, and during the time until the mixed raw material is filled in a calcination furnace and air in the furnace is removed.

The above-mentioned raw material powder can be mixed by dry milling without using a solvent, although it is generally mixed by wet milling with a solvent. The use of wet milling with a solvent is more capable of yielding a microscopically evenly mixed powder in a short time. Regarding the type of the mill, there can be used a ball mill, a vibrating mill, an attrition mill, or the like, although a ball mill is appropriate in terms of the facility cost. Regarding the solvent for use in the mixing, there can be used ethanol, methanol, isopropanol, hexane, acetone, water, and the like, although either ethanol or hexane is preferred when considering safety issues and prevention against oxidization of the raw material powder. The ratio of the raw material powder to the mixing solvent is determined depending on the viscosity of the mixed slurry. Preferred viscosity of the mixed slurry is about 50 to 500 cps. It is not preferable if the viscosity of the mixed slurry is lower than 50 cps, since the energy amount required for drying the mixed slurry increases. On the other hand, it is not preferable if the viscosity of the mixed slurry exceeds 500 cps, since a long time is required to obtain an evenly mixed powder.

The obtained mixed slurry may be left still in a dryer or the like to evaporate the solvent, although with use of a spray-dryer, a solvent-free mixed powder can be obtained in a short time without concern of reseparation of the raw material powder. Moreover, since the mixed powder obtained by using a spray-dryer exhibits a granular form of several tens to several hundreds micrometers, it exhibits an excellent fluidity and can be readily handled.

The mixed powder is formed into a compact having a bulk density of not higher than 40% by means of pressure forming, as required.

By forming the raw material powder into a compact, scattering caused by vacuum deaeration in the calcination process or the like can be prevented.

Calcination is performed in a nitrogen atmosphere having a pressure of 0.1 MPa to 100 MPa. If the pressure of the nitrogen atmosphere is lower than 0.1 MPa, volatilization of the raw material compound becomes noticeable, unevenness in the composition occurs, and the emission intensity is lowered. On the other hand, if the pressure of the nitrogen atmosphere is higher than 100 MPa, it is uneconomical since the inhibitory effect against volatilization of the raw material compound is unchanged. Therefore, these cases are both not preferable.

The calcination temperature is within the range of 1500° C. to 2200° C. If the calcination temperature is lower than 1500° C., a long time is required for yielding the fluorescent substance of the present invention. If the calcination temperature is higher than 2200° C., the raw material starts to melt. Therefore, these cases are both not preferable.

Regarding the furnace for use in calcination, since the calcination temperature is high, and the calcination atmosphere is a nitrogen-containing inert atmosphere, a metal resistance heating system or a graphite resistance heating system is suitable. Particularly preferred is an electric furnace which uses carbon as a material for high temperature portions of the furnace, because of reasons that will be described later. Regarding the calcination method, preferred is a sintering method, such as an atmospheric sintering method and a gas pressure sintering method, which does not apply any external mechanical pressure, since the calcination can be performed while the bulk density is kept low.

In addition, it is preferable if the calcination is performed with the coexistence of carbon or a carbon-containing compound, since the raw material mixture is contacted with a reducing atmosphere. Therefore, it is particularly preferable to use a raw material compound having a high oxygen content since the fluorescent substance having high brightness can be obtained.

The carbon or a carbon-containing compound used herein may be amorphous carbon, graphite, silicon carbide, and the like without particular limitations, although preferred are amorphous carbon, graphite, and the like. Examples thereof can also include carbon black, graphite powder, activated carbon, silicon carbide powder, a compacted product thereof, a sintered product thereof, and the like, all of which are able to offer similar effects.

The mode of coexistence can include a case where a powdery carbon is contained in the raw material mixture, a case where a container consisting of carbon or a carbon-containing compound is used, a case where carbon or a carbon-containing compound is arranged inside or outside a container which is free from carbon or a carbon-containing compound, a case where a heat generator or a heat insulator consisting of carbon or a carbon-containing compound is used. All of these arrangements are able to offer similar effects.

The above-mentioned mixed powder of the raw material compound is preferably calcinated in a state where the filling rate is kept at a bulk density of 40% or less. The bulk density means a volume filling rate of a powder, and is a value obtained by dividing the mass-to-volume ratio when filled in a certain container, by a theoretical density of a metal compound. As for the material of the container, alumina, calcia, magnesia, graphite, or boron nitride can be used, although a sintered product of boron nitride is suitable since it has low reactivity with a metal compound.

The reason why the calcination is performed in a state where the bulk density is kept at not higher than 40% is that, if calcination is performed in a state where free spaces are present around the raw material powder, contact between crystals decreases due to the crystal growth of the reaction product into these free spaces, and thus a crystal with less surface defects can be synthesized.

The filling content of the raw material mixture is preferably 20 volume % or more, in terms of a ratio of the bulk volume of the raw material mixture to the volume of a container in use in a state where the filling rate is kept at a bulk density of 40% or less. The reason why the calcination is performed while keeping the filling content of the raw material mixture at 20 volume % or more, relative to the volume of the container in use, is that volatilization of volatile components included in the raw material mixture is suppressed, and unevenness in the composition during the process of calcination is suppressed. Furthermore, if the filling content is set at 20 volume % or more, the filling content of the raw material mixture in the container increases, which is economical.

The calcination agglomerate containing the α-sialon-based fluorescent substance, which has been obtained by calcination, is ground by using a grinder made of a grinding medium or a lining material comprising alumina, silicon nitride, or α-sialon for usual use in plants, such as a ball mill and a jet mill. The grinding is performed until the average particle diameter reaches 20 μm or smaller. If the average particle diameter is greater than 20 μm, the powder becomes poor in fluidity and dispersibility into the resin. When combined with a light emitting-element to produce a light-emitting device, the powder exhibits partially uneven emission intensity.

The lower limit of the average particle diameter is not specifically limited. However, generally it takes a long time to grind into a particle size of 0.5 μm or smaller. Furthermore, such a size may lead to lowering in the emission intensity since many defects occur in the surfaces of the fluorescent substance powder.

The reason why the grinding medium or the lining material is made of alumina, silicon nitride, or α-sialon is that less contamination by impurities occurs in the process of grinding, and contaminant impurities do not greatly lower the emission intensity. In particular, it is not preferable to grind by using a grinder made of a grinding medium or a lining material containing iron or an iron family element, since the fluorescent substance is colored black, and iron or the iron family element is taken into the fluorescent substance in the heat-treatment process that will be described later, which causes a remarkable lowering in the emission intensity.

The α-sialon-based fluorescent substance powder obtained by grinding, is classified to achieve a desired particle size distribution as required. As to the method of classification, a sieving method, a wind classification, a liquid precipitation method, and a classification using selection tubes, or the like can be employed. In addition, there is no harm if the classification process is performed after the above-mentioned surface treatment process.

The fluorescent substance powder after the calcination, the fluorescent substance powder after the grinding treatment, or the fluorescent substance powder after the particle size adjustment by means of classification, is subjected to a heat-treatment process in an atmosphere of one or more components selected from nitrogen, ammonia, and hydrogen, at a temperature of 600° C. to 2200° C., as required. When a grinder made of a grinding medium or a lining material comprising alumina, silicon nitride, or α-sialon is used, contamination by impurities can be suppressed in the grinding process. Moreover, by heat-treating the ground powder in an atmosphere of one or more components selected from nitrogen, ammonia, and hydrogen, at a temperature of 600° C. to 2200° C., defects introduced in the grinding process can be reduced and the emission intensity can be recovered.

It is not preferable if the heat-treatment temperature is lower than 600° C., since the effect of removing defects from the fluorescent substance is reduced, and a long time is required to recover the emission intensity. On the other hand, it is not preferable if the heat-treatment temperature is higher than 2200° C., since the fluorescent substance powder partially melts, and particles firmly stick to each other again.

The heat-treatment is preferably performed in an atmosphere of one or more components selected from nitrogen, ammonia, and hydrogen. The heat-treatment in such an atmosphere is capable of removing defects without oxidizing the fluorescent substance powder. In addition, the heat-treatment is preferably performed at an atmospheric pressure of 0.1 MPa to 100 MPa, similarly to the calcination process.

If the atmospheric pressure is lower than 0.1 MPa, the fluorescent substance constituent element is partially volatilized depending on the heat-treatment temperature, and the emission intensity is lowered. On the other hand, if the pressure of the nitrogen atmosphere is higher than 100 MPa, it is uneconomical since the inhibitory effect against volatilization of the raw material compound is unchanged. Therefore, these cases are both not preferable.

Furthermore, by washing the product with water or a solvent consisting of an acid aqueous solution after calcination, the content of a glass phase, a second phase, or an impurity phase included in the product can be reduced, which improves the brightness. In this case, the acid can be selected from a single substance or a mixture of a sulfuric acid, a hydrochloric acid, a nitric acid, a hydrofluoric acid, an organic acid, and the like. In particular, the use of a mixture of a hydrofluoric acid and a sulfuric acid offers a great effect of removing impurities.

The transparent layer formed on the surface of the fluorescent substance of the present invention can be made by suspending the α-sialon-based fluorescent substance powder of the present invention in an organic solvent such as alcohol with use of a stirrer or an ultrasonic disperser; adding an alkaline aqueous solution such as an ammonia aqueous solution of an organometallic complex or metalalkoxide dropwise to the suspension to form a layer of metal oxide or metal hydroxide on the surfaces of the fluorescent substance particles; and thereafter, if necessary, calcinating the resultant product in air or a nonoxidative atmosphere such as nitrogen. The thickness of the transparent layer can be controlled by controlling the dropping condition, the stirring condition, and the suspending condition.

In addition, the transparent layer can also be formed by suspending the α-sialon-based fluorescent substance powder of the present invention in water, and adding a metal salt aqueous solution dropwise thereto while keeping a constant pH. In this method, the α-sialon-based fluorescent substance powder is suspended in an alkaline or buffer solution with use of an acid with adjusted pH, a stirrer or an ultrasonic disperser, and a metal salt aqueous solution is added dropwise thereto to form a layer of oxide or hydroxide of the metal on the surfaces of the α-sialon-based fluorescent substance particles. Then, the resultant product is subjected to filtration, washing, drying, and if necessary, calcination in air or a nonoxidative atmosphere such as nitrogen. In this method, also, the thickness of the transparent layer can be controlled by controlling the dropping condition of the metal salt aqueous solution, the stirring condition, and the suspending condition.

In order to obtain a fluorescent substance having high emission brightness, the contents of impurities are preferably as small as possible. In particular, if lots of Fe, Co, and Ni impurities are contained, light emission is inhibited. Therefore, it is preferable to select the raw material powder and control the synthesis process so that the total amount of these elements does not exceed 500 ppm.

When the fluorescent substance of the present invention is used where it is excited with an electron beam, conductivity can be given to the fluorescent substance by mixing a conductive inorganic substance therein. Examples of the conductive inorganic substance can include an oxide, an oxynitride, or a nitride containing one or more elements selected from Zn, Al, Ga, In, and Sn, or a mixture thereof.

When the fluorescent substance of the present invention needs to be mixed with red, green, blue, or such a color, an inorganic fluorescent substance or a fluorescent dye which exhibits such color can be mixed.

<Light-Emitting Device>

The light-emitting device of the present invention comprises at least a light emitting light source and the fluorescent substance of the present invention. Examples of the illumination device include an LED illumination device, an EL illumination device, and a fluorescence lamp.

The LED illumination device can be produced by using the fluorescent substance of the present invention in a known method such as those described in Japanese Unexamined Patent Application, First Publication No. H5-152609 and Japanese Unexamined Patent Application, First Publication No. H7-99345.

First Embodiment

As a first embodiment of the illuminator of the present invention, a shell-type white light-emitting diode lamp (LED illuminator) 1 as shown in FIG. 1 is described.

The shell-type white light-emitting diode lamp 1 comprises a first lead wire 2 and a second lead wire 3. The first lead wire 2 has a recess 2a. On the recess 2a is mounted a blue light-emitting diode element 4. In the blue light-emitting diode element 4, a lower electrode 4a is electrically connected to the bottom face of the recess 2a by a conductive paste while an upper electrode 4b is electrically connected to the second lead wire 3 by a bonding wire (thin metal wire) 5.

The first resin 6 is a transparent resin having a fluorescent substance 7 dispersed therein, and covers all over the blue light-emitting diode element 4. The apical end 2b of the first lead wire 2 including the recess 2a, the blue light-emitting diode element 4, and the first resin 6 having the fluorescent substance 7 dispersed therein are sealed by a transparent second resin 8.

The second resin 8 takes an approximately cylindrical shape as a whole, and its apical end is of a curved surface in a lens shape. Therefore, such a structure is commonly called a shell-type. The materials of the first resin 6 and the second resin 8 are preferably silicone resins, although they may be other resins such as a polycarbonate resin and an epoxy resin, or may also be a transparent material such as glass.

It is preferable to select a material which is as little susceptible to ultraviolet-induced deterioration as possible.

In addition, these resins may be the same or different, although a same resin is preferably used in terms of the readiness of production and the excellent adhesiveness.

Such a configuration yields a light-emitting device in which the fluorescent substance 7 emits light by being excited with light emitted from the blue light-emitting diode element 4.

Second Embodiment

Figure 2:
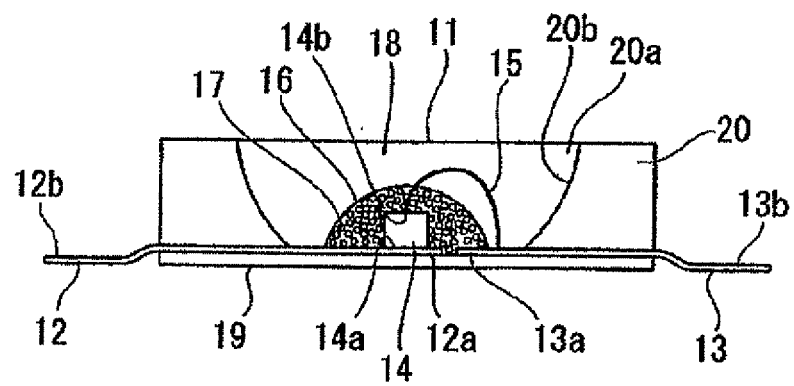
FIG. 2 is a cross-sectional view of the light-emitting device (LED illuminator) in a second embodiment of the present invention.

As a second embodiment of the illuminator of the present invention, a surface-mount chip-type white light-emitting diode lamp (LED illuminator) 11 as shown in FIG. 2 is described.

In the surface-mount chip-type white light-emitting diode lamp 11, a third lead wire 12 and a fourth lead wire 13 are fixed to a ceramic substrate 19 which uses a white alumina ceramics having high reflectance against visible light, ends 12a and 13a thereof are located in an approximate center of the substrate, and the other ends 12b and 13b are located outside to serve as electrodes to be soldered when being mounted on an electric substrate.

A blue light-emitting diode element 14 is mounted on and fixed to the end 12a of the third lead wire 12 in a center of the substrate. The lower electrode 14a of the blue light-emitting diode element 14 and the third lead wire 12 are electrically connected by a conductive paste while the upper electrode 14b and the fourth lead wire 13 are electrically connected by a bonding wire (thin metal wire) 15.

The third resin 16 is a transparent resin having a fluorescent substance 17 dispersed therein, and covers all over the blue light-emitting diode element 14. In addition, a side wall member 20 is fixed on the ceramic substrate 19, and a bowl-shaped hole 20a is formed in a center of the side wall member 20.

The hole 20a is to store the blue light-emitting diode element 14 and the third resin 16 having the fluorescent substance 17 dispersed therein, and a portion facing the center is of a slope 20b. This slope 20b is a reflection surface for extracting light in a forward direction, and the shape of the curved surface of the slope 20b is determined with consideration of the reflection direction of light. In addition, at least the slope 20b constituting the reflection surface is of a face with white or metallic glossiness to have high reflectance against visible light.

The side wall member 20 may be formed of a white silicone resin, for example. The central hole 20a forms a recess as a final shape of the chip-type light-emitting diode lamp. Here, a transparent fourth resin 18 is filled so that the blue light-emitting diode element 14 and the third resin 16 having the fluorescent substance 17 dispersed therein are all sealed in.

The materials of the third resin 16 and the fourth resin 18 are preferably silicone resins, although they may be other materials such as a polycarbonate resin and an epoxy resin, or may also be a transparent material such as glass.

It is preferable to select a material which is as little susceptible to ultraviolet-induced deterioration as possible.

In addition, these resins may be the same or different, although the same resin is preferably used in terms of facilitating production and excellent adhesiveness.

Such a configuration yields a light-emitting device in which the fluorescent substance 17 emits light by being excited with light emitted from the blue light-emitting diode element 14.

Hereunder is a description of configurations which are common to both the first embodiment and the second embodiment.

The light emitting light source (blue light-emitting diode element 4 or 14) is desirably a light source which emits light having a wavelength of 330 to 500 nm, and particularly preferably an ultraviolet (or violet) LED light emitting-element of 330 to 420 nm, or a blue LED light emitting-element of 420 to 500 nm.

If the light emitting-element is an EL element, those capable of emitting light having an emission spectrum from 330 nm to 500 nm can be employed without limitations. Accordingly, either an inorganic or organic EL element can be employed.

Regarding the light emitting-element, those capable of emitting light having an emission spectrum from 330 nm to 500 nm can be employed without limitations. In a case of LED, a gallium nitride-based compound semiconductor is preferably used in terms of efficiency. The LED light emitting-element can be obtained by forming a nitride-based compound semiconductor on a substrate by the MOCVD method, the HVPE method, or the like, and preferably by forming a light emission layer of $In_\alpha Al_\beta Ga_{1-\alpha-\beta}N$ (where $0 \leq \alpha$, $0 \leq \beta$, and $\alpha+\beta \leq 1$).

The structure of the semiconductor includes a homostructure, a heterostructure, or a double heterostructure having an MIS junction, a PIN junction, a pn junction, or the like. The emission wavelength can be variously set by selecting the material of the semiconductor layer and the mixing degree of crystals thereof. Moreover, a semiconductor active layer can also be used to form a thin film which generates a quantum effect in a single quantum well structure or a multiple quantum well structure.

If the light emitting-element is an EL element, those capable of emitting light having an emission spectrum from 330 nm to 500 nm can be employed without limitations. Accordingly, either an inorganic or organic EL element can be employed.

If the light emitting-element is an inorganic EL, any one of a thin layer film, a dispersion type, a direct current driving type, and an alternating current driving type can be employed. In addition, the fluorescent substance involved in EL emission is not specifically limited, although a sulfide-based substance is suitably used.

If the light emitting-element is an organic EL device, any one of a lamination type, a doping type, a low molecular system, and a polymer system can be employed.

The gallium nitride-based compound semiconductor which is conventionally used as an LED light emitting-element has a very high refractive index of about 2.4 to 2.5. For this reason, when a gallium nitride-based compound semiconductor is used as a light emitting-element, it is required to use a resin having a high refractive index. The first resin and the third resin including the fluorescent substance preferably have high refractive indexes from this point of view. On the other hand, in order to improve the efficiency of extracting light from the light emitting-element, it is preferable that the second resin and the fourth resin, which are arranged outside the first resin and the third resin, have lower refractive indexes than those of the first resin and the third resin.

In the light-emitting device, not only a single use of the fluorescent substance of the present invention but also a combination use with a fluorescent substance having different light emission characteristics can be employed to constitute a light-emitting device which emits a desired color. An example thereof includes a combination of an ultraviolet LED light emitting-element of 330 to 420 nm, a blue fluorescent substance which is excited by this wavelength and has an emission peak at a wavelength from 420 nm to 480 nm, and the fluorescent substance of the present invention. Such a blue fluorescent substance includes $BaMgAl_{10}O_{17}$:Eu. In this configuration, when an ultraviolet ray emitted from the LED is irradiated on the fluorescent substance, two types of light exhibiting two colors, blue and yellow, are emitted and mixed to thereby serve as a white light-emitting device.

With use of the light-emitting device of the present invention comprising a light emitting light source and a fluorescent substance which uses the fluorescent substance of the present invention and CaAlSiN$_3$:Eu, the light-emitting device can emit light from warm white having a strong red component to orange. The fluorescent substance of the present invention used herein preferably uses Eu as the M(1) element. When a blue light emitting-element is used as the light emitting light source, yellow emitted from the fluorescent substance of the present invention, red emitted from CaAlSiN$_3$:Eu, and blue from the light emitting-element are mixed, so that a light-emitting device which emits light of warm white having a strong red component can be obtained. In this case, by further adding a green-light emitting fluorescent substance such as a β-sialon fluorescent substance and Ca$_3$Sc$_2$Si$_3$O$_{12}$:Ce to the fluorescent substance of the present invention and CaAlSiN$_3$:Eu, a white light-emitting device having a high color-rendering property can be obtained.

In addition, when the fluorescent substance of the present invention and CaAlSiN$_3$:Eu are combined with an ultraviolet to near-ultraviolet light emitting-element, a light-emitting device which emits orange light can be obtained. In this case, by further adding a green-light emitting fluorescent substance such as a β-sialon fluorescent substance, or a blue-light emitting fluorescent substance such as BaMgAl$_{10}$O$_{17}$:Eu to the fluorescent substance of the present invention and CaAlSiN$_3$:Eu, a light-emitting device having an extremely high color-rendering property can be obtained.

EXAMPLES

The present invention is described in further detail below using examples, although the examples are disclosed for better understanding of the present invention and the present invention is in no way limited by the examples.

Examples 1 to 10

First, Examples 1 to 10 of the fluorescent substance of the present invention are described.

As for the raw material powder, a silicon nitride powder having an average particle diameter of 0.5 μm, an oxygen content of 0.93 weight %, and an α-type content of 92%, an aluminum nitride powder, a strontium nitride powder, and an europium nitride powder were used.

In order to obtain a compound represented by the general formula Sr$_x$M(1)$_y$M(2)$_z$Si$_{12-(m+n)}$Al$_{(m+n)}$O$_n$N$_{16-n}$ where the x, y, z, m, and n values are as shown in Table 1, the europium nitride powder, the strontium nitride powder, the aluminum nitride powder, and the silicon nitride powder were weighed at the blending ratios shown in Table 2 (expressed by mass ratio, which is the same in the other following Examples), and mixed using an agate pestle and mortar for 30 minutes. In this case, M(1) was Eu.

TABLE 1

| | x | y | z | m | n |
|---|---|---|---|---|---|
| Example 1 | 0.110 | 0.015 | 0.000 | 0.250 | 0.000 |
| Example 2 | 0.235 | 0.015 | 0.000 | 0.500 | 0.000 |
| Example 3 | 0.360 | 0.015 | 0.000 | 0.750 | 0.000 |
| Example 4 | 0.485 | 0.015 | 0.000 | 1.000 | 0.000 |
| Example 5 | 0.610 | 0.015 | 0.000 | 1.250 | 0.000 |
| Example 6 | 0.735 | 0.015 | 0.000 | 1.500 | 0.000 |
| Example 7 | 0.860 | 0.015 | 0.000 | 1.750 | 0.000 |
| Example 8 | 0.985 | 0.015 | 0.000 | 2.000 | 0.000 |
| Example 9 | 1.110 | 0.015 | 0.000 | 2.250 | 0.000 |
| Example 10 | 1.235 | 0.015 | 0.000 | 2.500 | 0.000 |

TABLE 2

| | Sr$_3$N$_2$ | EuN | Si$_3$N$_4$ | AlN | Emission intensity |
|---|---|---|---|---|---|
| Example 1 | 0.186 | 0.044 | 9.591 | 0.179 | 86.000 |
| Example 2 | 0.390 | 0.043 | 9.216 | 0.351 | 97.000 |
| Example 3 | 0.588 | 0.042 | 8.853 | 0.517 | 100.000 |
| Example 4 | 0.778 | 0.041 | 8.504 | 0.678 | 98.000 |
| Example 5 | 0.961 | 0.040 | 8.166 | 0.832 | 93.000 |
| Example 6 | 1.138 | 0.040 | 7.840 | 0.982 | 90.000 |
| Example 7 | 1.309 | 0.039 | 7.525 | 1.126 | 85.000 |
| Example 8 | 1.475 | 0.038 | 7.221 | 1.266 | 80.000 |
| Example 9 | 1.635 | 0.038 | 6.926 | 1.401 | 78.000 |
| Example 10 | 1.790 | 0.037 | 6.641 | 1.532 | 76.000 |

The obtained mixed powder was formed into a compact at a bulk density of about 28% by using an aluminum mold, and was filled in a crucible made of boron nitride. The proportion of the compact volume to the crucible volume was set to about 80%. In the respective processes of weighing, mixing, and molding the powder, all operations were performed in a glove box capable of keeping a nitrogen atmosphere at 1 ppm or less of moisture and 1 ppm or less of oxygen.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 11 μm.

Figure 3:
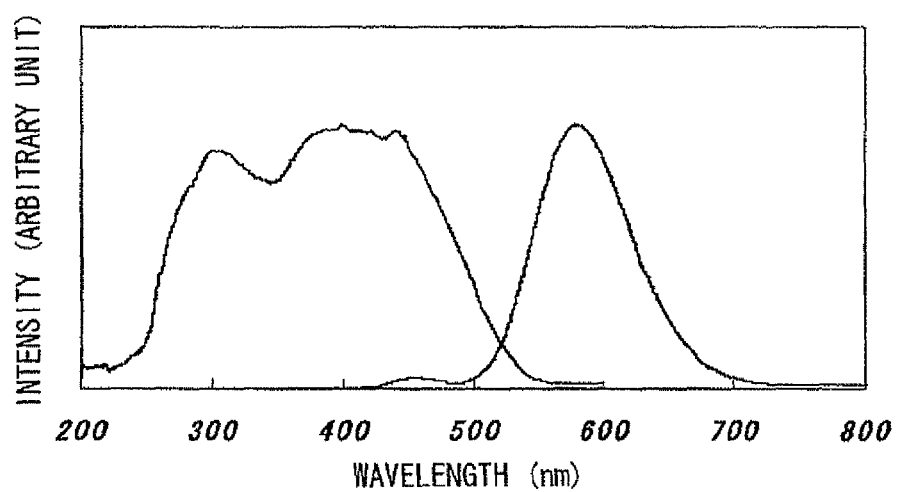
FIG. 3 shows an emission spectrum and an excitation spectrum of a fluorescent substance in Example 3 of the present invention.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, as shown in FIG. 3, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensity was 100 counts. The count rate had an arbitrary unit as it varied depending on the measuring equipment and conditions.

In Examples 1 to 10, the obtained powder X-ray diffraction pattern was similar to that of Example 3.

This fluorescent substance was exposed to an 80% humidity and 80° C. temperature condition for 100 hours, by which almost no reduction in the brightness was seen.

Figure 4:
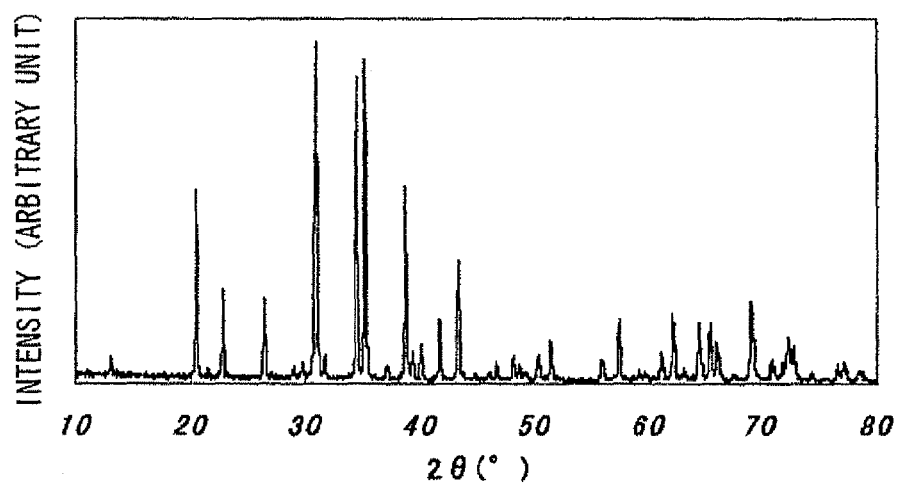
FIG. 4 shows an X-ray diffraction chart of the fluorescent substance in Example 3 of the present invention.

Next, the compound synthesized in Example 3 was ground using an agate mortar, and was subjected to powder X-ray diffractometry using Cu—Kα radiation. The resulting chart is shown in FIG. 4. From FIG. 4, the compound synthesized in Example 3 was found to consist of α-sialon and a small amount of SrSi$_6$N$_8$. The data of FIG. 4 were analyzed by the Rietveld method to investigate the ratios of the constituent phases, which showed that α-sialon accounted for 97 volume % and SrSi$_6$N$_8$ accounted for 3 volume %.

Examples 11 to 21

Examples 11 to 21 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium nitride powder, a strontium oxide powder, and an europium oxide powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 3, the europium oxide powder, the strontium nitride powder, the strontium oxide powder, the aluminum nitride powder, and the silicon nitride powder were weighed at the blending ratios shown in Table 4, and mixed using an agate pestle and mortar for 30 minutes. In this case, M(1) was Eu.

TABLE 3

|  | x | y | z | m | n |
|---|---|---|---|---|---|
| Example 11 | 0.360 | 0.015 | 0.000 | 0.750 | 0.015 |
| Example 12 | 0.360 | 0.015 | 0.000 | 0.750 | 0.115 |
| Example 13 | 0.360 | 0.015 | 0.000 | 0.750 | 0.215 |
| Example 14 | 0.360 | 0.015 | 0.000 | 0.750 | 0.315 |
| Example 15 | 0.360 | 0.015 | 0.000 | 0.750 | 0.350 |
| Example 16 | 0.985 | 0.015 | 0.000 | 2.000 | 0.415 |
| Example 17 | 0.985 | 0.015 | 0.000 | 2.000 | 0.515 |
| Example 18 | 0.985 | 0.015 | 0.000 | 2.000 | 0.615 |
| Example 19 | 0.985 | 0.015 | 0.000 | 2.000 | 0.715 |
| Example 20 | 0.985 | 0.015 | 0.000 | 2.000 | 0.815 |
| Example 21 | 0.985 | 0.015 | 0.000 | 2.000 | 0.975 |

TABLE 4

|  | $Sr_3N_2$ | SrO | $Eu_2O_3$ | $Si_3N_4$ | AlN | Emission intensity |
|---|---|---|---|---|---|---|
| Example 11 | 0.587 | 0.000 | 0.044 | 8.841 | 0.528 | 101.000 |
| Example 12 | 0.424 | 0.174 | 0.044 | 8.760 | 0.597 | 96.000 |
| Example 13 | 0.261 | 0.349 | 0.044 | 8.680 | 0.666 | 92.000 |
| Example 14 | 0.098 | 0.523 | 0.044 | 8.601 | 0.734 | 90.000 |
| Example 15 | 0.041 | 0.584 | 0.044 | 8.573 | 0.758 | 89.000 |
| Example 16 | 0.875 | 0.640 | 0.041 | 6.917 | 1.528 | 94.000 |
| Example 17 | 0.726 | 0.799 | 0.041 | 6.843 | 1.591 | 92.000 |
| Example 18 | 0.576 | 0.959 | 0.041 | 6.770 | 1.654 | 88.000 |
| Example 19 | 0.426 | 1.119 | 0.041 | 6.697 | 1.717 | 82.000 |
| Example 20 | 0.277 | 1.279 | 0.041 | 6.624 | 1.780 | 79.000 |
| Example 21 | 0.037 | 1.534 | 0.041 | 6.507 | 1.881 | 72.000 |

The obtained mixed powder was formed into a compact at a bulk density of about 26% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 12 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensities are as shown in Table 4. The count rate had an arbitrary unit as it varied depending on the measuring equipment and conditions.

In Examples 11 to 21, the obtained powder X-ray diffraction pattern was similar to that of Example 12. This fluorescent substance was exposed to an 80% humidity and 80° C. temperature condition for 100 hours, by which almost no reduction in the brightness was seen.

Figure 5:
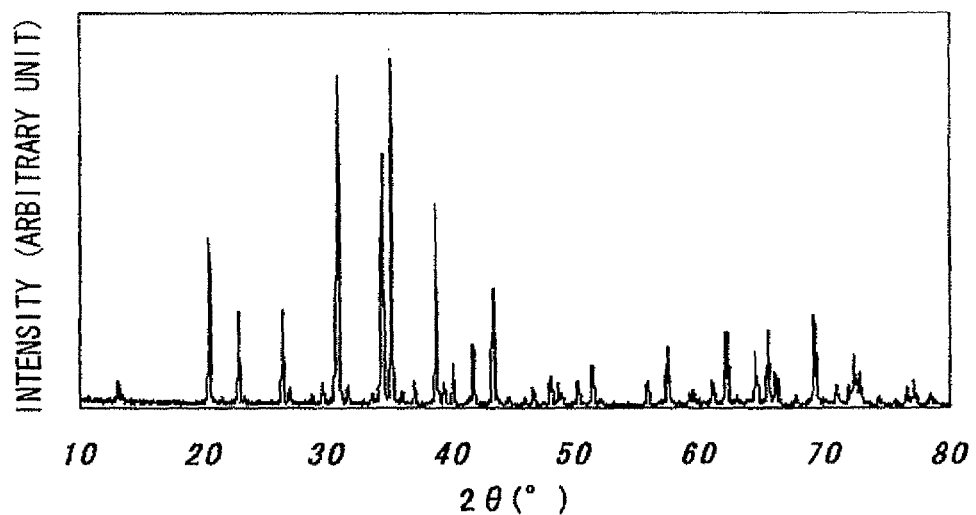
FIG. 5 shows an X-ray diffraction chart of the fluorescent substance in Example 12 of the present invention.

Next, the compound synthesized in Example 12 was ground using an agate mortar, and was subjected to powder X-ray diffractometry using Cu—Kα radiation. The resulting chart is shown in FIG. 5. From FIG. 5, the compound synthesized in Example 12 was found to consist of α-sialon, a small amount of $SrSi_6N_8$, and a small amount of β-sialon or unreacted silicon nitride. The data of FIG. 5 were analyzed by the Rietveld method to investigate the ratios of the constituent phases, which showed that α-sialon accounted for 97 volume %, $SrSi_6N_8$ accounted for 2 volume %, and β-sialon or unreacted silicon nitride accounted for 1 volume %.

Examples 22 to 31

Examples 22 to 31 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium silicide powder, and an europium oxide powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 5, the europium oxide powder, the strontium silicide powder, the aluminum nitride powder, and the silicon nitride powder were weighed at the blending ratios shown in Table 6, and mixed using an agate pestle and mortar for 30 minutes. In this case, M(1) was Eu.

TABLE 5

|  | x | y | z | m | n |
|---|---|---|---|---|---|
| Example 22 | 0.110 | 0.015 | 0.000 | 0.250 | 0.015 |
| Example 23 | 0.235 | 0.015 | 0.000 | 0.500 | 0.015 |
| Example 24 | 0.360 | 0.015 | 0.000 | 0.750 | 0.015 |
| Example 25 | 0.485 | 0.015 | 0.000 | 1.000 | 0.015 |
| Example 26 | 0.610 | 0.015 | 0.000 | 1.250 | 0.015 |
| Example 27 | 0.735 | 0.015 | 0.000 | 1.500 | 0.015 |
| Example 28 | 0.860 | 0.015 | 0.000 | 1.750 | 0.015 |
| Example 29 | 0.985 | 0.015 | 0.000 | 2.000 | 0.015 |
| Example 30 | 1.110 | 0.015 | 0.000 | 2.250 | 0.015 |
| Example 31 | 1.235 | 0.015 | 0.000 | 2.500 | 0.015 |

TABLE 6

|  | $SrSi_2$ | $Eu_2O_3$ | $Si_3N_4$ | AlN | Emission intensity |
|---|---|---|---|---|---|
| Example 22 | 0.279 | 0.046 | 9.484 | 0.191 | 88.000 |
| Example 23 | 0.590 | 0.046 | 8.995 | 0.369 | 98.000 |
| Example 24 | 0.897 | 0.046 | 8.515 | 0.543 | 104.000 |
| Example 25 | 1.198 | 0.045 | 8.042 | 0.715 | 101.000 |
| Example 26 | 1.494 | 0.045 | 7.578 | 0.883 | 98.000 |
| Example 27 | 1.785 | 0.045 | 7.121 | 1.049 | 97.000 |
| Example 28 | 2.072 | 0.044 | 6.671 | 1.212 | 92.000 |
| Example 29 | 2.354 | 0.044 | 6.229 | 1.373 | 86.000 |
| Example 30 | 2.632 | 0.044 | 5.794 | 1.531 | 81.000 |
| Example 31 | 2.905 | 0.043 | 5.365 | 1.686 | 78.000 |

The obtained mixed powder was formed into a compact at a bulk density of about 28% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 10 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensities are as shown in Table 6. The count rate had an arbitrary unit as it varied depending on the measuring equipment and conditions.

In Examples 22 to 31, the obtained powder X-ray diffraction pattern was similar to that of Example 24. This fluorescent substance was exposed to an 80% humidity and 80° C. temperature condition for 100 hours, by which almost no reduction in the brightness was seen.

Figure 6:
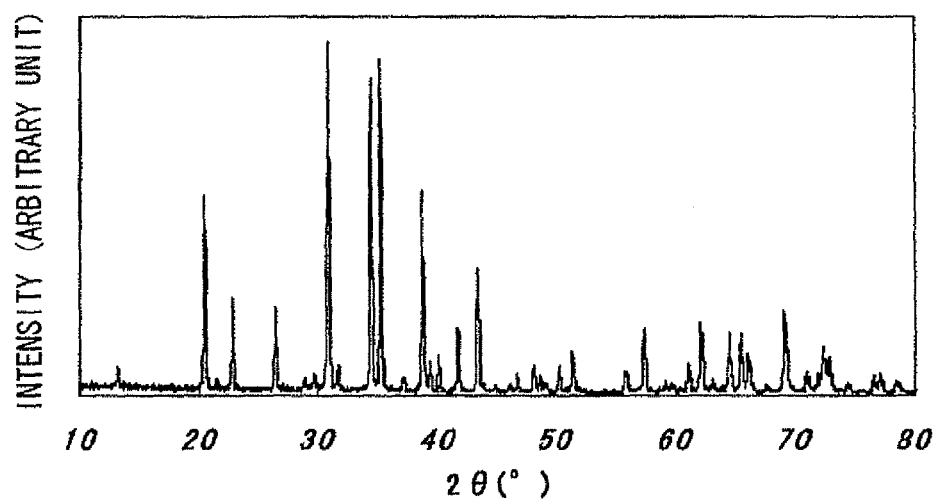
FIG. 6 shows an X-ray diffraction chart of the fluorescent substance in Example 24 of the present invention.

Next, the compound synthesized in Example 24 was ground using an agate mortar, and was subjected to powder X-ray diffractometry using Cu—Kα radiation. The resulting chart is shown in FIG. 6. From FIG. 6, the compound synthesized in Example 24 was found to consist of α-sialon and a small amount of $SrSi_6N_8$. The data of FIG. 6 were analyzed by the Rietveld method to investigate the ratios of the constituent phases, which showed that α-sialon accounted for 98 volume % and $SrSi_6N_8$ accounted for 2 volume %.

Examples 32 to 41

Examples 32 to 41 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium silicon nitride ($Sr_2Si_5N_8$) powder, and an europium oxide powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 7, the europium oxide powder, the strontium silicon nitride ($Sr_2Si_5N_8$) powder, the aluminum nitride powder, and the silicon nitride powder were weighed at the blending ratios shown in Table 8, and mixed using an agate pestle and mortar for 30 minutes. In this case, M(1) was Eu.

TABLE 7

|  | x | y | z | m | n |
|---|---|---|---|---|---|
| Example 32 | 0.110 | 0.015 | 0.000 | 0.250 | 0.015 |
| Example 33 | 0.235 | 0.015 | 0.000 | 0.500 | 0.015 |
| Example 34 | 0.360 | 0.015 | 0.000 | 0.750 | 0.015 |
| Example 35 | 0.485 | 0.015 | 0.000 | 1.000 | 0.015 |
| Example 36 | 0.610 | 0.015 | 0.000 | 1.250 | 0.015 |
| Example 37 | 0.735 | 0.015 | 0.000 | 1.500 | 0.015 |
| Example 38 | 0.860 | 0.015 | 0.000 | 1.750 | 0.015 |
| Example 39 | 0.985 | 0.015 | 0.000 | 2.000 | 0.015 |
| Example 40 | 1.110 | 0.015 | 0.000 | 2.250 | 0.015 |
| Example 41 | 1.235 | 0.015 | 0.000 | 2.500 | 0.015 |

TABLE 8

|  | $Sr_2Si_5N_6$ | $Eu_2O_3$ | $Si_3N_4$ | AlN | Emission intensity |
|---|---|---|---|---|---|
| Example 32 | 0.411 | 0.046 | 9.354 | 0.190 | 89.000 |
| Example 33 | 0.861 | 0.045 | 8.732 | 0.362 | 100.000 |
| Example 34 | 1.296 | 0.044 | 8.132 | 0.528 | 105.000 |
| Example 35 | 1.715 | 0.044 | 7.554 | 0.688 | 104.000 |
| Example 36 | 2.119 | 0.043 | 6.996 | 0.842 | 101.000 |
| Example 37 | 2.510 | 0.042 | 6.456 | 0.992 | 97.000 |
| Example 38 | 2.888 | 0.041 | 5.935 | 1.136 | 93.000 |
| Example 39 | 3.253 | 0.041 | 5.431 | 1.275 | 88.000 |
| Example 40 | 3.606 | 0.040 | 4.943 | 1.410 | 85.000 |
| Example 41 | 3.948 | 0.039 | 4.471 | 1.541 | 81.000 |

The obtained mixed powder was formed into a compact at a bulk density of about 28% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 9 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensities are as shown in Table 8. The count rate had an arbitrary unit as it varied depending on the measuring equipment and conditions.

In Examples 32 to 41, the obtained powder X-ray diffraction pattern was similar to that of Example 34. This fluorescent substance was exposed to an 80% humidity and 80° C. temperature condition for 100 hours, by which almost no reduction in the brightness was seen.

Figure 7:
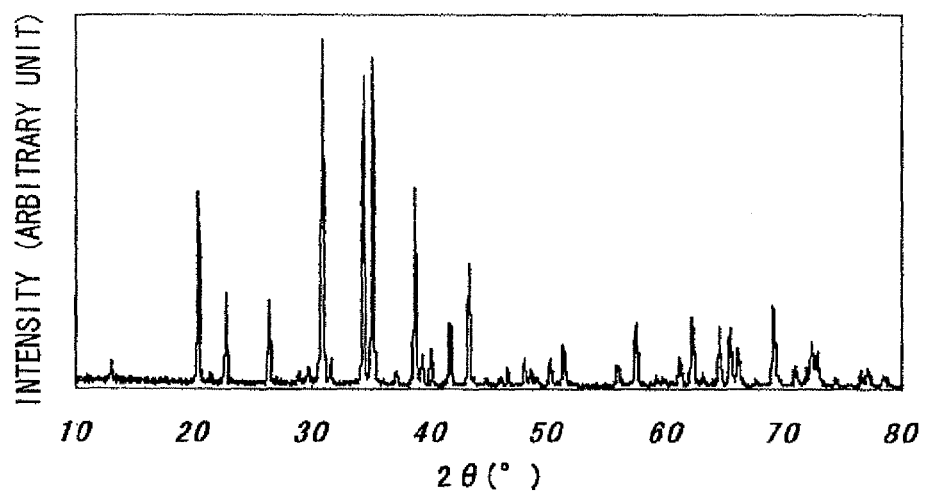
FIG. 7 shows an X-ray diffraction chart of the fluorescent substance in Example 34 of the present invention.

Next, the compound synthesized in Example 34 was ground using an agate mortar, and was subjected to powder X-ray diffractometry using Cu—Kα radiation. The resulting chart is shown in FIG. 7. From FIG. 7, the compound synthesized in Example 34 was found to consist of α-sialon and a small amount of $SrSi_6N_8$. The data of FIG. 7 were analyzed by the Rietveld method to investigate the ratios of the constituent phases, which showed that α-sialon accounted for 98 volume % and $SrSi_6N_8$ accounted for 2 volume %.

Examples 42 to 51

Examples 42 to 51 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium silicon nitride ($SrSiN_2$) powder, and an europium oxide powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 9, the europium oxide powder, the strontium silicon nitride ($SrSiN_2$) powder, the aluminum nitride powder, and the silicon nitride powder were weighed at the blending ratios shown in Table 10, and mixed using an agate pestle and mortar for 30 minutes. In this case, M(1) was Eu.

TABLE 9

|  | x | y | z | m | n |
| --- | --- | --- | --- | --- | --- |
| Example 42 | 0.110 | 0.015 | 0.000 | 0.250 | 0.015 |
| Example 43 | 0.235 | 0.015 | 0.000 | 0.500 | 0.015 |
| Example 44 | 0.360 | 0.015 | 0.000 | 0.750 | 0.015 |
| Example 45 | 0.485 | 0.015 | 0.000 | 1.000 | 0.015 |
| Example 46 | 0.610 | 0.015 | 0.000 | 1.250 | 0.015 |
| Example 47 | 0.735 | 0.015 | 0.000 | 1.500 | 0.015 |
| Example 48 | 0.860 | 0.015 | 0.000 | 1.750 | 0.015 |
| Example 49 | 0.985 | 0.015 | 0.000 | 2.000 | 0.015 |
| Example 50 | 1.110 | 0.015 | 0.000 | 2.250 | 0.015 |
| Example 51 | 1.235 | 0.015 | 0.000 | 2.500 | 0.015 |

TABLE 10

|  | $SrSiN_2$ | $Eu_2O_3$ | $Si_3N_4$ | AlN | Emission intensity |
| --- | --- | --- | --- | --- | --- |
| Example 42 | 0.276 | 0.046 | 9.488 | 0.190 | 87.000 |
| Example 43 | 0.579 | 0.045 | 9.014 | 0.362 | 98.000 |

TABLE 10-continued

|  | $SrSiN_2$ | $Eu_2O_3$ | $Si_3N_4$ | AlN | Emission intensity |
| --- | --- | --- | --- | --- | --- |
| Example 44 | 0.871 | 0.044 | 8.557 | 0.528 | 103.000 |
| Example 45 | 1.152 | 0.044 | 8.116 | 0.688 | 101.000 |
| Example 46 | 1.424 | 0.043 | 7.691 | 0.842 | 97.000 |
| Example 47 | 1.687 | 0.042 | 7.279 | 0.992 | 95.000 |
| Example 48 | 1.941 | 0.041 | 6.882 | 1.136 | 93.000 |
| Example 49 | 2.186 | 0.041 | 6.498 | 1.275 | 86.000 |
| Example 50 | 2.423 | 0.040 | 6.126 | 1.410 | 81.000 |
| Example 51 | 2.653 | 0.039 | 5.766 | 1.541 | 78.000 |

The obtained mixed powder was formed into a compact at a bulk density of about 28% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 11 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensities are as shown in Table 10. The count rate had an arbitrary unit as it varied depending on the measuring equipment and conditions.

In Examples 42 to 51, the obtained powder X-ray diffraction pattern was similar to that of Example 44. This fluorescent substance was exposed to an 80% humidity and 80° C. temperature condition for 100 hours, by which almost no reduction in the brightness was seen.

Figure 8:
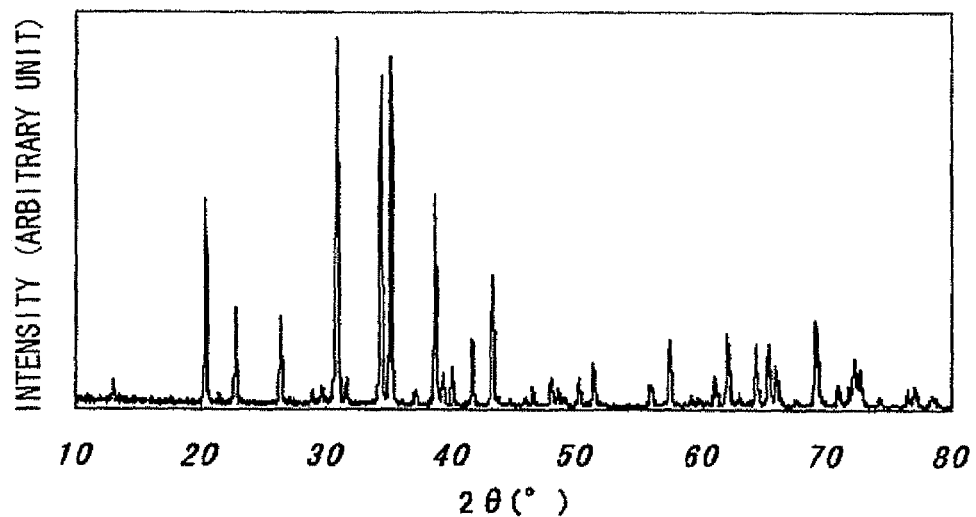
FIG. 8 shows an X-ray diffraction chart of the fluorescent substance in Example 44 of the present invention.

Next, the compound synthesized in Example 44 was ground using an agate mortar, and was subjected to powder X-ray diffractometry using Cu—Kα radiation. The resulting chart is shown in FIG. 8. From FIG. 8, the compound synthesized in Example 44 was found to consist of α-sialon and a small amount of $SrSi_6N_8$. The data of FIG. 8 were analyzed by the Rietveld method to investigate the ratios of the constituent phases, which showed that α-sialon accounted for 98 volume % and $SrSi_6N_8$ accounted for 2 volume %.

Examples 52 to 61

Examples 52 to 61 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium silicon nitride (SrSiN$_2$) powder, and an europium silicon nitride (EuSiN$_2$) powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 11, the europium silicon nitride (EuSiN$_2$) powder, the strontium silicon nitride (SrSiN$_2$) powder, the aluminum nitride powder, and the silicon nitride powder were weighed at the blending ratios shown in Table 12, and mixed using an agate pestle and mortar for 30 minutes. In this case, M(1) was Eu.

TABLE 11

|  | x | y | z | m | n |
|---|---|---|---|---|---|
| Example 52 | 0.110 | 0.015 | 0.000 | 0.250 | 0.000 |
| Example 53 | 0.235 | 0.015 | 0.000 | 0.500 | 0.000 |
| Example 54 | 0.360 | 0.015 | 0.000 | 0.750 | 0.000 |
| Example 55 | 0.485 | 0.015 | 0.000 | 1.000 | 0.000 |
| Example 56 | 0.610 | 0.015 | 0.000 | 1.250 | 0.000 |
| Example 57 | 0.735 | 0.015 | 0.000 | 1.500 | 0.000 |
| Example 58 | 0.860 | 0.015 | 0.000 | 1.750 | 0.000 |
| Example 59 | 0.985 | 0.015 | 0.000 | 2.000 | 0.000 |
| Example 60 | 1.110 | 0.015 | 0.000 | 2.250 | 0.000 |
| Example 61 | 1.235 | 0.015 | 0.000 | 2.500 | 0.000 |

TABLE 12

|  | SrSiN$_2$ | EuSiN$_2$ | Si$_3$N$_4$ | AlN | Emission intensity |
|---|---|---|---|---|---|
| Example 52 | 0.276 | 0.054 | 9.491 | 0.179 | 88.000 |
| Example 53 | 0.579 | 0.053 | 9.016 | 0.351 | 99.000 |
| Example 54 | 0.871 | 0.053 | 8.559 | 0.517 | 102.000 |
| Example 55 | 1.153 | 0.052 | 8.118 | 0.678 | 100.000 |
| Example 56 | 1.425 | 0.051 | 7.692 | 0.833 | 98.000 |
| Example 57 | 1.687 | 0.050 | 7.281 | 0.982 | 97.000 |
| Example 58 | 1.941 | 0.049 | 6.884 | 1.126 | 94.000 |
| Example 59 | 2.186 | 0.048 | 6.499 | 1.266 | 85.000 |
| Example 60 | 2.424 | 0.047 | 6.127 | 1.401 | 80.000 |
| Example 61 | 2.654 | 0.047 | 5.767 | 1.532 | 79.000 |

The obtained mixed powder was formed into a compact at a bulk density of about 27% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 12 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm and an emission spectrum peak at yellow light of 580 nm by excitation with blue light of 450 nm. The peak emission intensities are as shown in Table 12. The count rate had an arbitrary unit as it varied depending on the measuring equipment and conditions.

In Examples 52 to 61, the obtained powder X-ray diffraction pattern was similar to that of Example 54. This fluorescent substance was exposed to an 80% humidity and 80° C. temperature condition for 100 hours, by which almost no reduction in the brightness was seen.

Figure 9:
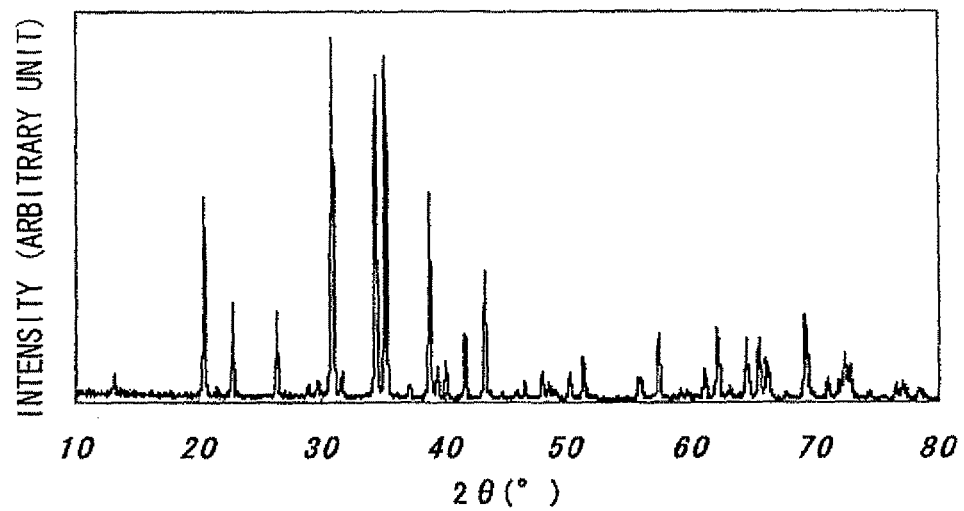
FIG. 9 shows an X-ray diffraction chart of the fluorescent substance in Example 54 of the present invention.

Next, the compound synthesized in Example 54 was ground using an agate mortar, and was subjected to powder X-ray diffractometry using Cu—Kα radiation. The resulting chart is shown in FIG. 9. From FIG. 9, the compound synthesized in Example 54 was found to consist of α-sialon and a small amount of SrSi$_6$N$_8$. The data of FIG. 9 were analyzed by the Rietveld method to investigate the ratios of the constituent phases, which showed that α-sialon accounted for 98 volume % and SrSi$_6$N$_8$ accounted for 2 volume %.

Examples 62 to 71

Examples 62 to 71 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium silicon nitride (Sr$_2$Si$_5$N$_8$) powder, and an europium silicon nitride (Eu$_2$Si$_5$N$_8$) powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 13, the europium silicon nitride (Eu$_2$Si$_5$N$_8$) powder, the strontium silicon nitride (Sr$_2$Si$_5$N$_8$) powder, the aluminum nitride powder, and the silicon nitride powder were weighed at the blending ratios shown in Table 14, and mixed using an agate pestle and mortar for 30 minutes. In this case, M(1) was Eu.

TABLE 13

|  | x | y | z | m | n |
|---|---|---|---|---|---|
| Example 62 | 0.110 | 0.015 | 0.000 | 0.250 | 0.000 |
| Example 63 | 0.235 | 0.015 | 0.000 | 0.500 | 0.000 |
| Example 64 | 0.360 | 0.015 | 0.000 | 0.750 | 0.000 |
| Example 65 | 0.485 | 0.015 | 0.000 | 1.000 | 0.000 |
| Example 66 | 0.610 | 0.015 | 0.000 | 1.250 | 0.000 |
| Example 67 | 0.735 | 0.015 | 0.000 | 1.500 | 0.000 |
| Example 68 | 0.860 | 0.015 | 0.000 | 1.750 | 0.000 |
| Example 69 | 0.985 | 0.015 | 0.000 | 2.000 | 0.000 |
| Example 70 | 1.110 | 0.015 | 0.000 | 2.250 | 0.000 |
| Example 71 | 1.235 | 0.015 | 0.000 | 2.500 | 0.000 |

TABLE 14

|  | Sr$_2$Si$_5$N$_8$ | Eu$_2$Si$_5$N$_8$ | Si$_3$N$_4$ | AlN | Emission intensity |
|---|---|---|---|---|---|
| Example 62 | 0.411 | 0.073 | 9.337 | 0.179 | 88.000 |
| Example 63 | 0.861 | 0.072 | 8.716 | 0.351 | 102.000 |
| Example 64 | 1.296 | 0.070 | 8.116 | 0.517 | 107.000 |
| Example 65 | 1.715 | 0.069 | 7.538 | 0.678 | 103.000 |
| Example 66 | 2.120 | 0.068 | 6.980 | 0.833 | 100.000 |
| Example 67 | 2.511 | 0.067 | 6.441 | 0.982 | 98.000 |
| Example 68 | 2.888 | 0.066 | 5.920 | 1.126 | 95.000 |

TABLE 14-continued

|  | $Sr_2Si_5N_8$ | $Eu_2Si_5N_8$ | $Si_3N_4$ | AlN | Emission intensity |
|---|---|---|---|---|---|
| Example 69 | 3.253 | 0.064 | 5.416 | 1.266 | 89.000 |
| Example 70 | 3.607 | 0.063 | 4.928 | 1.401 | 84.000 |
| Example 71 | 3.949 | 0.062 | 4.457 | 1.532 | 79.000 |

The obtained mixed powder was formed into a compact at a bulk density of about 25% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 13 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensities are as shown in Table 14. The count rate had an arbitrary unit as it varied depending on the measuring equipment and conditions.

In Examples 62 to 71, the obtained powder X-ray diffraction pattern was similar to that of Example 64. This fluorescent substance was exposed to an 80% humidity and 80° C. temperature condition for 100 hours, by which almost no reduction in the brightness was seen.

Figure 10:
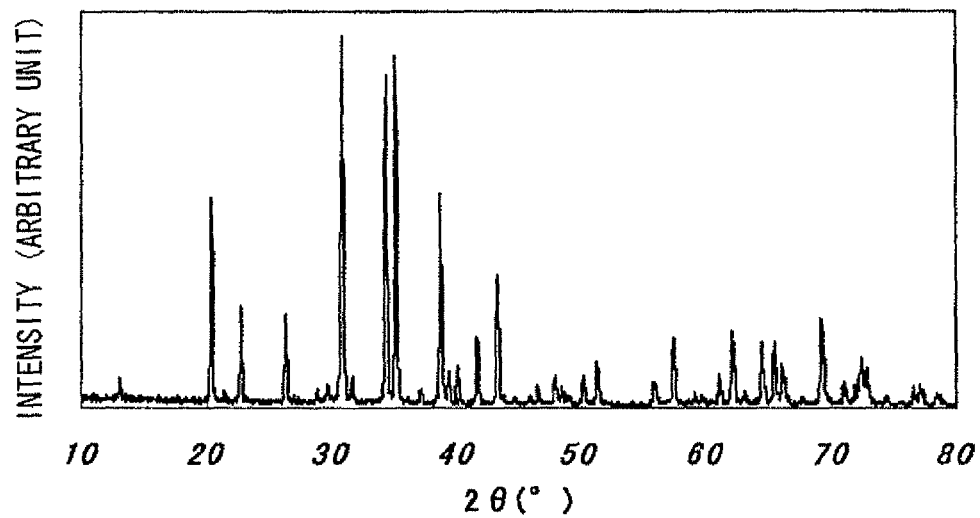
FIG. 10 shows an X-ray diffraction chart of the fluorescent substance in Example 64 of the present invention.

Next, the compound synthesized in Example 64 was ground using an agate mortar, and was subjected to powder X-ray diffractometry using Cu—Kα radiation. The resulting chart is shown in FIG. 10. From FIG. 10, the compound synthesized in Example 64 was found to consist of α-sialon and a small amount of $SrSi_6N_8$. The data of FIG. 10 were analyzed by the Rietveld method to investigate the ratios of the constituent phases, which showed that α-sialon accounted for 98 volume % and $SrSi_6N_8$ accounted for 2 volume % of $SrSi_6N_8$.

Examples 72 to 80

Examples 72 to 80 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium silicide powder, a calcium silicide powder, and an europium oxide powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 15, the europium oxide powder, the strontium silicide powder, the calcium silicide powder, the aluminum nitride powder, and the silicon nitride powder were weighed at the blending ratios shown in Table 16, and mixed using an agate pestle and mortar for 30 minutes. In this case, M(1) was Eu and M(2) was Ca.

TABLE 15

|  | x | y | z | m | n |
|---|---|---|---|---|---|
| Example 72 | 0.324 | 0.015 | 0.036 | 0.750 | 0.015 |
| Example 73 | 0.288 | 0.015 | 0.072 | 0.750 | 0.015 |
| Example 74 | 0.252 | 0.015 | 0.108 | 0.750 | 0.015 |
| Example 75 | 0.216 | 0.015 | 0.144 | 0.750 | 0.015 |
| Example 76 | 0.180 | 0.015 | 0.180 | 0.750 | 0.015 |
| Example 77 | 0.144 | 0.015 | 0.216 | 0.750 | 0.015 |
| Example 78 | 0.108 | 0.015 | 0.252 | 0.750 | 0.015 |
| Example 79 | 0.072 | 0.015 | 0.288 | 0.750 | 0.015 |
| Example 80 | 0.036 | 0.015 | 0.324 | 0.750 | 0.015 |

TABLE 16

|  | $SrSi_2$ | $CaSi_2$ | $Eu_2O_3$ | $Si_3N_4$ | AlN | Emission intensity |
|---|---|---|---|---|---|---|
| Example 72 | 0.809 | 0.060 | 0.046 | 8.540 | 0.545 | 98.000 |
| Example 73 | 0.721 | 0.121 | 0.046 | 8.565 | 0.546 | 96.000 |
| Example 74 | 0.633 | 0.182 | 0.046 | 8.591 | 0.548 | 95.000 |
| Example 75 | 0.544 | 0.243 | 0.046 | 8.617 | 0.550 | 93.000 |
| Example 76 | 0.455 | 0.305 | 0.046 | 8.643 | 0.551 | 91.000 |
| Example 77 | 0.365 | 0.367 | 0.047 | 8.669 | 0.553 | 88.000 |
| Example 78 | 0.275 | 0.429 | 0.047 | 8.695 | 0.555 | 79.000 |
| Example 79 | 0.184 | 0.492 | 0.047 | 8.722 | 0.556 | 75.000 |
| Example 80 | 0.092 | 0.555 | 0.047 | 8.748 | 0.558 | 72.000 |

The obtained mixed powder was formed into a compact at a bulk density of about 26% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 11 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensities are as shown in Table 16. The count rate had an arbitrary unit as it varied depending on the measuring equipment and conditions.

In Examples 72 to 80, the obtained powder X-ray diffraction pattern was similar to that of Example 75. This fluorescent substance was exposed to an 80% humidity and 80° C. temperature condition for 100 hours, by which almost no reduction in the brightness was seen.

Figure 11:
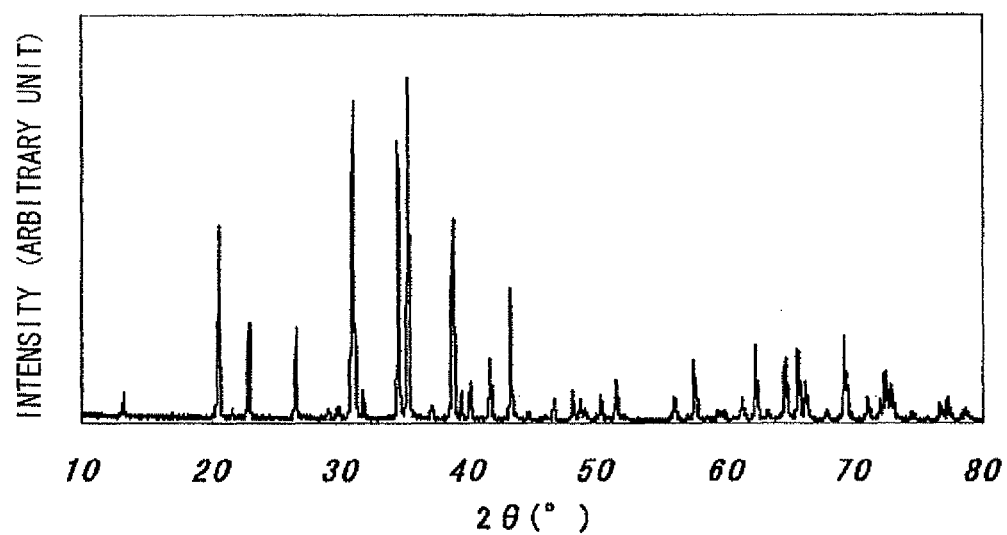
FIG. 11 shows an X-ray diffraction chart of the fluorescent substance in Example 75 of the present invention.

Next, the compound synthesized in Example 75 was ground using an agate mortar, and was subjected to powder X-ray diffractometry using Cu—Kα radiation. The resulting chart is shown in FIG. 11. From FIG. 11, the compound synthesized in Example 75 was found to consist of α-sialon and a small amount of $SrSi_6N_8$. The data of FIG. 11 were analyzed by the Rietveld method to investigate the ratios of the constituent phases, which showed that α-sialon accounted for 99 volume % and $SrSi_6N_8$ accounted for 1 volume %.

Examples 81 to 89

Examples 81 to 89 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium silicide powder, an yttrium oxide powder, and an europium oxide powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 17, the europium oxide powder, the strontium silicide powder, the yttrium oxide powder, the aluminum nitride powder, and the silicon nitride powder were weighed at the blending ratios shown in Table 18, and mixed using an agate pestle and mortar for 30 minutes. In this case, M(1) was Eu and M(2) was Y.

TABLE 17

|  | x | y | z | m | n |
|---|---|---|---|---|---|
| Example 81 | 0.323 | 0.015 | 0.025 | 0.750 | 0.053 |
| Example 82 | 0.285 | 0.015 | 0.050 | 0.750 | 0.090 |
| Example 83 | 0.248 | 0.015 | 0.075 | 0.750 | 0.128 |
| Example 84 | 0.210 | 0.015 | 0.100 | 0.750 | 0.165 |
| Example 85 | 0.173 | 0.015 | 0.125 | 0.750 | 0.203 |
| Example 86 | 0.135 | 0.015 | 0.150 | 0.750 | 0.240 |
| Example 87 | 0.098 | 0.015 | 0.175 | 0.750 | 0.278 |
| Example 88 | 0.535 | 0.015 | 1.467 | 5.500 | 2.215 |
| Example 89 | 0.260 | 0.015 | 1.650 | 5.500 | 2.490 |

TABLE 18

|  | $SrSi_2$ | $Y_2O_3$ | $Eu_2O_3$ | $Si_3N_4$ | AlN | Emission intensity |
|---|---|---|---|---|---|---|
| Example 81 | 0.802 | 0.049 | 0.046 | 8.534 | 0.569 | 99.000 |
| Example 82 | 0.708 | 0.098 | 0.046 | 8.554 | 0.595 | 97.000 |
| Example 83 | 0.614 | 0.146 | 0.046 | 8.574 | 0.621 | 94.000 |
| Example 84 | 0.520 | 0.195 | 0.045 | 8.593 | 0.646 | 93.000 |
| Example 85 | 0.427 | 0.243 | 0.045 | 8.613 | 0.672 | 90.000 |
| Example 86 | 0.334 | 0.291 | 0.045 | 8.632 | 0.698 | 89.000 |
| Example 87 | 0.241 | 0.339 | 0.045 | 8.652 | 0.723 | 77.000 |
| Example 88 | 1.081 | 2.327 | 0.037 | 2.112 | 4.443 | 72.000 |
| Example 89 | 0.521 | 2.593 | 0.037 | 2.276 | 4.568 | 71.000 |

The obtained mixed powder was formed into a compact at a bulk density of about 28% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 13 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensities are as shown in Table 18. The count rate had an arbitrary unit as it varied depending on the measuring equipment and conditions.

Figure 12:
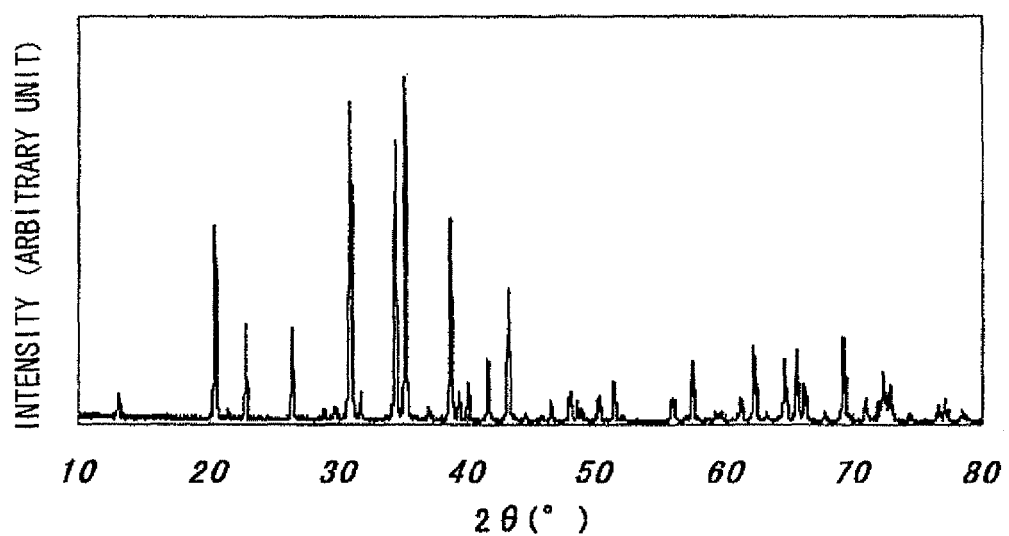
FIG. 12 shows an X-ray diffraction chart of the fluorescent substance in Example 85 of the present invention.

Next, the compound synthesized in Example 85 was ground using an agate mortar, and was subjected to powder X-ray diffractometry using Cu—Kα radiation. The resulting chart is shown in FIG. 12. From FIG. 12, the compound synthesized in Example 85 was found to consist of α-sialon and a small amount of $SrSi_6N_8$. The data of FIG. 12 were analyzed by the Rietveld method to investigate the ratios of the constituent phases, which showed that α-sialon accounted for 99 volume % and $SrSi_6N_8$ accounted for 1 volume %.

In Examples 81 to 89, the obtained powder X-ray diffraction pattern was similar to that of Example 85. This fluorescent substance was exposed to an 80% humidity and 80° C. temperature condition for 100 hours, by which almost no reduction in the brightness was seen.

Examples 90 to 99

Examples 90 to 99 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium silicide powder, a cerium oxide powder, and an ytterbium oxide powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 19, the strontium silicide powder, the cerium oxide powder, the ytterbium oxide powder, the aluminum nitride powder, and the silicon nitride powder were weighed at the blending ratios shown in Table 20, and mixed using an agate pestle and mortar for 30 minutes. In this case, M(1) was Ce or Yb.

TABLE 19

|  | x | y | z | m | n |
|---|---|---|---|---|---|
| Example 90 | 0.356 | 0.013 | 0.000 | 0.750 | 0.019 |
| Example 91 | 0.338 | 0.025 | 0.000 | 0.750 | 0.038 |
| Example 92 | 0.319 | 0.038 | 0.000 | 0.750 | 0.056 |
| Example 93 | 0.300 | 0.050 | 0.000 | 0.750 | 0.075 |
| Example 94 | 0.270 | 0.070 | 0.000 | 0.750 | 0.105 |
| Example 95 | 0.373 | 0.002 | 0.000 | 0.750 | 0.002 |
| Example 96 | 0.371 | 0.004 | 0.000 | 0.750 | 0.004 |
| Example 97 | 0.368 | 0.008 | 0.000 | 0.750 | 0.008 |
| Example 98 | 0.364 | 0.011 | 0.000 | 0.750 | 0.011 |
| Example 99 | 0.356 | 0.019 | 0.000 | 0.750 | 0.019 |

TABLE 20

|  | $SrSi_2$ | $CeO_2$ | $Yb_2O_3$ | $Si_3N_4$ | AlN | Emission intensity |
|---|---|---|---|---|---|---|
| Example 90 | 0.888 | 0.037 | 0.000 | 8.528 | 0.546 | 84.000 |
| Example 91 | 0.840 | 0.074 | 0.000 | 8.527 | 0.559 | 96.000 |
| Example 92 | 0.792 | 0.111 | 0.000 | 8.526 | 0.571 | 101.000 |
| Example 93 | 0.744 | 0.148 | 0.000 | 8.525 | 0.583 | 106.000 |
| Example 94 | 0.667 | 0.207 | 0.000 | 8.523 | 0.602 | 98.000 |
| Example 95 | 0.932 | 0.000 | 0.006 | 8.527 | 0.535 | 74.000 |
| Example 96 | 0.927 | 0.000 | 0.013 | 8.524 | 0.536 | 85.000 |
| Example 97 | 0.916 | 0.000 | 0.026 | 8.520 | 0.538 | 97.000 |
| Example 98 | 0.906 | 0.000 | 0.038 | 8.515 | 0.541 | 87.000 |
| Example 99 | 0.886 | 0.000 | 0.064 | 8.505 | 0.545 | 73.000 |

The obtained mixed powder was formed into a compact at a bulk density of about 25% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 10 μm.

Figure 13:
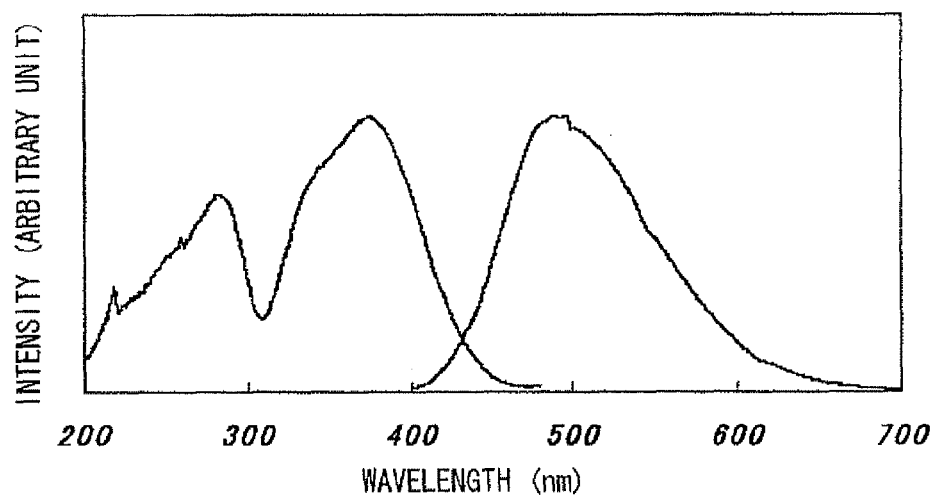
FIG. 13 shows an emission spectrum and an excitation spectrum of the fluorescent substance in Example 93 of the present invention.
Figure 14:
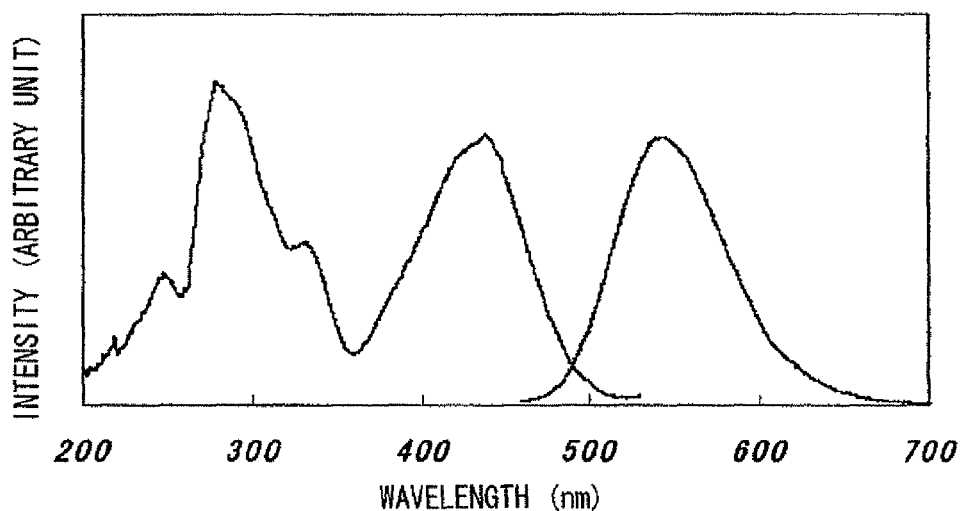
FIG. 14 shows an emission spectrum and an excitation spectrum of the fluorescent substance in Example 97 of the present invention.

The powder of Example 93 was irradiated with light having a wavelength of 365 nm by using an ultraviolet lamp, as a result of which white-blue light emission was confirmed. Moreover, in Example 97, green light emission was confirmed. The emission spectra and the excitation spectra of these powders were measured using a fluorescence spectrophotometer. As a result, regarding the peak wavelengths of the excitation and emission spectra, the powder of Example 93 was found to be a fluorescent substance having an excitation spectrum peak at 375 nm, and a peak at white-blue light of 490 nm. Moreover, regarding the peak wavelengths of the excitation and emission spectra, the powder of Example 97 was found to be a fluorescent substance having an excitation spectrum peak at 440 nm, and a peak at green light of 545 nm. FIG. 13 and FIG. 14 show the emission spectra and the excitation spectra of Example 93 and Example 97. The peak emission intensities are as shown in Table 20. The count rate had an arbitrary unit as it varied depending on the measuring equipment and conditions.

Figure 15:
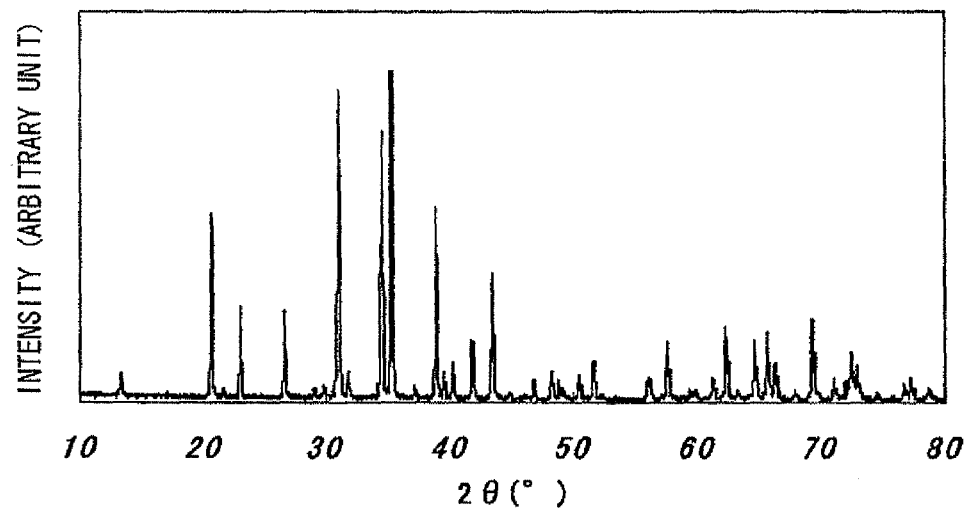
FIG. 15 shows an X-ray diffraction chart of the fluorescent substance in Example 93 of the present invention.
Figure 16:
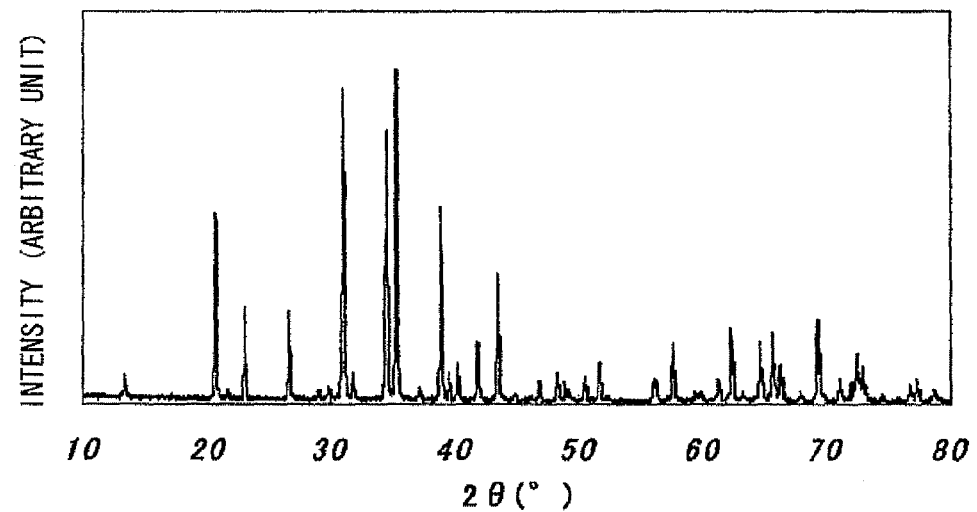
FIG. 16 shows an X-ray diffraction chart of the fluorescent substance in Example 97 of the present invention.

Next, the compounds synthesized in Example 93 and Example 97 were ground using an agate mortar, and were subjected to powder X-ray diffractometry using Cu—Kα radiation. The resulting charts are shown in FIG. 15 and FIG. 16. From FIGS. 15 and 16, the compounds synthesized in Example 93 and Example 97 were both found to consist of α-sialon and a small amount of $SrSi_6N_8$. The data of FIG. 15 and FIG. 16 were analyzed by the Rietveld method to investigate the ratios of the constituent phases, which showed that in both cases α-sialon accounted for 99 volume % and $SrSi_6N_8$ accounted for 1 volume %.

In Examples 90 to 94, the obtained powder X-ray diffraction pattern was similar to that of Example 93. Moreover, in Examples 95 to 99. The obtained powder X-ray diffraction pattern was similar to that of Example 97. These fluorescent substances were exposed to an 80% humidity and 80° C. temperature condition for 100 hours, by which almost no reduction in the brightness was seen.

Examples 100 to 109

Examples 100 to 109 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium silicide powder, and an europium oxide powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 21, the europium oxide powder, the strontium silicide powder, the aluminum nitride powder, and the silicon nitride powder were weighed at the blending ratios shown in Table 22, and mixed using an agate pestle and mortar for 30 minutes. In this case, M(1) was Eu.

TABLE 21

|  | x | y | z | m | n |
|---|---|---|---|---|---|
| Example 100 | 0.371 | 0.004 | 0.000 | 0.750 | 0.004 |
| Example 101 | 0.368 | 0.008 | 0.000 | 0.750 | 0.008 |
| Example 102 | 0.364 | 0.011 | 0.000 | 0.750 | 0.011 |
| Example 103 | 0.360 | 0.015 | 0.000 | 0.750 | 0.015 |
| Example 104 | 0.356 | 0.019 | 0.000 | 0.750 | 0.019 |
| Example 105 | 0.353 | 0.023 | 0.000 | 0.750 | 0.023 |
| Example 106 | 0.345 | 0.030 | 0.000 | 0.750 | 0.030 |
| Example 107 | 0.338 | 0.038 | 0.000 | 0.750 | 0.038 |
| Example 108 | 0.319 | 0.056 | 0.000 | 0.750 | 0.056 |
| Example 109 | 0.300 | 0.075 | 0.000 | 0.750 | 0.075 |

TABLE 22

|  | $SrSi_2$ | $Eu_2O_3$ | $Si_3N_4$ | AlN | Emission intensity |
|---|---|---|---|---|---|
| Example 100 | 0.927 | 0.011 | 8.526 | 0.536 | 86.000 |
| Example 101 | 0.917 | 0.023 | 8.522 | 0.539 | 92.000 |
| Example 102 | 0.907 | 0.034 | 8.518 | 0.541 | 98.000 |
| Example 103 | 0.897 | 0.046 | 8.515 | 0.543 | 104.000 |
| Example 104 | 0.886 | 0.057 | 8.511 | 0.545 | 101.000 |
| Example 105 | 0.876 | 0.068 | 8.508 | 0.548 | 96.000 |
| Example 106 | 0.856 | 0.091 | 8.500 | 0.552 | 92.000 |
| Example 107 | 0.837 | 0.114 | 8.493 | 0.556 | 87.000 |
| Example 108 | 0.787 | 0.170 | 8.476 | 0.567 | 82.000 |
| Example 109 | 0.738 | 0.226 | 8.458 | 0.578 | 76.000 |

The obtained mixed powder was formed into a compact at a bulk density of about 26% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 11 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensities are as shown in Table 22. The count rate had an arbitrary unit as it varied depending on the measuring equipment and conditions.

Next, the compound synthesized in Example 103 was ground using an agate mortar, and was subjected to powder X-ray diffractometry using Cu—Kα radiation, which confirmed that the obtained chart was similar to that of Example 24.

In Examples 100 to 109, the obtained powder X-ray diffraction pattern was similar to that of Example 103. This fluorescent substance was exposed to an 80% humidity and 80° C. temperature condition for 100 hours, by which almost no reduction in the brightness was seen.

Examples 110 to 118

Examples 110 to 118 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium silicide powder, an europium oxide powder, and a lithium nitride powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 23, the europium oxide powder, the strontium silicide powder, the aluminum nitride powder, the silicon nitride powder, and the lithium nitride powder were weighed at the blending ratios shown in Table 24, and mixed using an agate pestle and mortar for 30 minutes. In this case, M(1) was Eu and M(2) was Li.

TABLE 23

|  | x | y | z | m | n |
|---|---|---|---|---|---|
| Example 110 | 0.341 | 0.015 | 0.038 | 0.750 | 0.015 |
| Example 111 | 0.323 | 0.015 | 0.075 | 0.750 | 0.015 |
| Example 112 | 0.285 | 0.015 | 0.150 | 0.750 | 0.015 |
| Example 113 | 0.248 | 0.015 | 0.225 | 0.750 | 0.015 |
| Example 114 | 0.210 | 0.015 | 0.300 | 0.750 | 0.015 |
| Example 115 | 0.173 | 0.015 | 0.375 | 0.750 | 0.015 |
| Example 116 | 0.135 | 0.015 | 0.450 | 0.750 | 0.015 |
| Example 117 | 0.098 | 0.015 | 0.525 | 0.750 | 0.015 |
| Example 118 | 0.060 | 0.015 | 0.600 | 0.750 | 0.015 |

TABLE 24

|  | $SrSi_2$ | $Li_3N$ | $Eu_2O_3$ | $Si_3N_4$ | AlN | Emission intensity |
|---|---|---|---|---|---|---|
| Example 110 | 0.851 | 0.008 | 0.046 | 8.553 | 0.544 | 101.000 |
| Example 111 | 0.805 | 0.015 | 0.046 | 8.591 | 0.544 | 100.000 |
| Example 112 | 0.712 | 0.030 | 0.046 | 8.667 | 0.545 | 97.000 |
| Example 113 | 0.620 | 0.045 | 0.046 | 8.743 | 0.546 | 91.000 |
| Example 114 | 0.527 | 0.061 | 0.046 | 8.820 | 0.547 | 85.000 |
| Example 115 | 0.433 | 0.076 | 0.046 | 8.897 | 0.548 | 83.000 |
| Example 116 | 0.340 | 0.091 | 0.046 | 8.974 | 0.549 | 82.000 |
| Example 117 | 0.246 | 0.107 | 0.046 | 9.051 | 0.550 | 77.000 |
| Example 118 | 0.152 | 0.122 | 0.046 | 9.129 | 0.551 | 76.000 |

The obtained mixed powder was formed into a compact at a bulk density of about 26% by using an aluminum mold, and was filled in a crucible made of boron nitride. The proportion of the compact volume to the crucible volume was set to about 80%. In the respective processes of weighing, mixing, and molding the powder, all operations were performed in a glove box capable of keeping a nitrogen atmosphere at 1 ppm or less of moisture and 1 ppm or less of oxygen.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 1900° C. at a rate of 500° C./hour, and the temperature of 1900° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 12 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 570 nm by excitation with blue light of 450 nm. The emission wavelength was shifted to the shorter wavelength side as the M(2) value increased. The peak emission intensities are as shown in Table 24. The count rate had an arbitrary unit as it varied depending on the measuring equipment and conditions.

Figure 17:
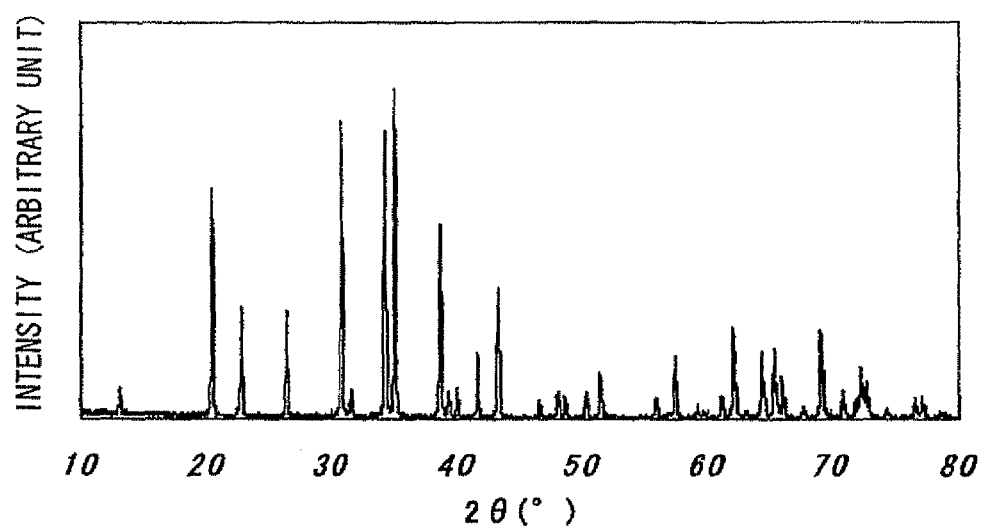
FIG. 17 shows an X-ray diffraction chart of the fluorescent substance in Example 112 of the present invention.

Next, the compound synthesized in Example 112 was ground using an agate mortar, and was subjected to powder X-ray diffractometry using Cu—Kα radiation. The resulting chart is shown in FIG. 17. From FIG. 17, the compound synthesized in Example 112 was found to consist of a single phase of α-sialon.

In Examples 110 to 118, the obtained powder X-ray diffraction pattern was similar to that of Example 112. This fluorescent substance was exposed to an 80% humidity and 80° C. temperature condition for 100 hours, by which almost no reduction in the brightness was seen.

Examples 119 to 127

Examples 119 to 127 of the fluorescent substance of the present invention are described below.

As for the raw material powder, a silicon nitride powder having an average particle diameter of 0.5 μm, an oxygen content of 0.93 weight %, and an α-type content of 92%, an aluminum nitride powder, a strontium silicide powder, an europium oxide powder, and a lithium silicon nitride ($LiSi_2N_3$) powder were used.

In order to obtain a compound represented by the general formula $Sr_xM(1)_yM(2)_zSi_{12-(m+n)}Al_{(m+n)}O_nN_{16-n}$ where the x, y, z, m, and n values are as shown in Table 25, the europium oxide powder, the strontium silicide powder, the aluminum nitride powder, the silicon nitride powder, and the lithium silicon nitride ($LiSi_2N_3$) powder were weighed at the blending ratios shown in Table 26, and mixed using an agate pestle and mortar for 30 minutes. In this case, M(1) was Eu and M(2) was Li.

TABLE 25

| | x | y | z | m | n |
|---|---|---|---|---|---|
| Example 119 | 0.341 | 0.015 | 0.038 | 0.750 | 0.015 |
| Example 120 | 0.323 | 0.015 | 0.075 | 0.750 | 0.015 |
| Example 121 | 0.285 | 0.015 | 0.150 | 0.750 | 0.015 |
| Example 122 | 0.248 | 0.015 | 0.225 | 0.750 | 0.015 |
| Example 123 | 0.210 | 0.015 | 0.300 | 0.750 | 0.015 |
| Example 124 | 0.173 | 0.015 | 0.375 | 0.750 | 0.015 |
| Example 125 | 0.135 | 0.015 | 0.450 | 0.750 | 0.015 |
| Example 126 | 0.098 | 0.015 | 0.525 | 0.750 | 0.015 |
| Example 127 | 0.060 | 0.015 | 0.600 | 0.750 | 0.015 |

TABLE 26

| | $SrSi_2$ | $LiSi_2N_3$ | $Eu_2O_3$ | $Si_3N_4$ | AlN | Emission intensity |
|---|---|---|---|---|---|---|
| Example 119 | 0.850 | 0.068 | 0.046 | 8.485 | 0.543 | 104.000 |
| Example 120 | 0.803 | 0.137 | 0.046 | 8.456 | 0.543 | 101.000 |
| Example 121 | 0.710 | 0.273 | 0.046 | 8.397 | 0.543 | 98.000 |
| Example 122 | 0.617 | 0.410 | 0.046 | 8.339 | 0.543 | 95.000 |
| Example 123 | 0.523 | 0.547 | 0.046 | 8.280 | 0.544 | 91.000 |
| Example 124 | 0.430 | 0.684 | 0.046 | 8.221 | 0.544 | 84.000 |
| Example 125 | 0.337 | 0.821 | 0.046 | 8.162 | 0.544 | 82.000 |
| Example 126 | 0.243 | 0.958 | 0.046 | 8.104 | 0.544 | 79.000 |
| Example 127 | 0.150 | 1.095 | 0.046 | 8.045 | 0.544 | 77.000 |

The obtained mixed powder was formed into a compact at a bulk density of about 22% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 1900° C. at a rate of 500° C./hour, and the temperature of 1900° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 11 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 570 nm by excitation with blue light of 450 nm. The emission wavelength was shifted to the shorter wavelength side as the M(2) value increased. The peak emission intensities are as shown in Table 26. The count rate had an arbitrary unit as it varied depending on the measuring equipment and conditions.

Figure 18:
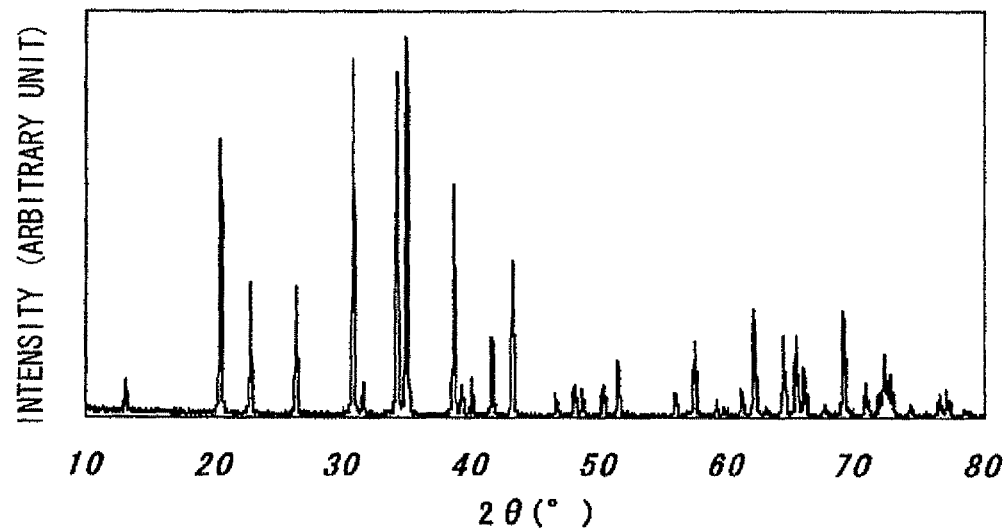
FIG. 18 shows an X-ray diffraction chart of the fluorescent substance in Example 121 of the present invention.

Next, the compound synthesized in Example 121 was ground using an agate mortar, and was subjected to powder X-ray diffractometry using Cu—Kα radiation. The resulting chart is shown in FIG. 18. From FIG. 18, the compound synthesized in Example 121 was found to consist of a single phase of α-sialon.

In Examples 119 to 127, the obtained powder X-ray diffraction pattern was similar to that of Example 121. This fluorescent substance was exposed to an 80% humidity and 80° C. temperature condition for 100 hours, by which almost no reduction in the brightness was seen.

Examples 128 to 138

The calcination agglomerate obtained in the same manner as that of Example 24 was cracked using an agate pestle and mortar, and was classified by sieving or elutriation, to yield a powder having a desired average particle diameter and a desired average aspect ratio as shown in Table 27.

The obtained powder was dispersed at 10 weight % in a silicone resin by using a kneader. With use of the cross section of this resin, the emission intensity and the dispersibility in the resin were evaluated. The emission intensity was standardized assuming that the maximum value was 100. In addition, the dispersibility in the resin was evaluated by the proportion of powder particles showing voids in the interface between the resin and the powder particles. Lower proportion of particles showing voids means better dispersibility.

TABLE 27

| | Average particle diameter (μm) | Average aspect ratio | Emission intensity | Void rate (%) |
|---|---|---|---|---|
| Example 128 | 0.200 | 1.200 | 77.000 | 5.100 |
| Example 129 | 1.000 | 1.200 | 86.000 | 3.200 |
| Example 130 | 3.000 | 1.100 | 92.000 | 2.400 |
| Example 131 | 6.000 | 1.400 | 97.000 | 2.200 |
| Example 132 | 11.000 | 1.200 | 100.000 | 1.300 |
| Example 133 | 11.200 | 1.800 | 97.000 | 1.500 |
| Example 134 | 10.400 | 2.300 | 92.000 | 3.300 |
| Example 135 | 11.100 | 2.800 | 86.000 | 5.400 |
| Example 136 | 20.000 | 1.300 | 98.000 | 2.100 |

TABLE 27-continued

|  | Average particle diameter (μm) | Average aspect ratio | Emission intensity | Void rate (%) |
|---|---|---|---|---|
| Example 137 | 32.000 | 1.300 | 87.000 | 3.000 |
| Example 138 | 48.000 | 1.200 | 81.000 | 5.800 |

Examples 139 and 140

A powder produced by adding 0.5 weight % of a lithium fluoride powder in terms of the outer percentage to the composition of Example 24 and carrying out the same procedure as that of Example 24, and a powder produced by using a crucible made of graphite were examined for the emission intensity, the fluorine content, and the boron content. The emission intensity was standardized assuming that the emission intensity of Example 24 was 100. In addition, the surface of the sample produced by using a graphite crucible was changed into silicon carbide. Therefore, the silicon carbide layer on the surface was removed before the evaluation.

TABLE 28

|  | Crucible material | Fluorine content (ppm) | Boron content (ppm) | Emission intensity |
|---|---|---|---|---|
| Example 139 | hBN | 120.000 | 480.000 | 108.000 |
| Example 140 | graphite | 110.000 | 0.000 | 87.000 |

Example 141

The powder obtained in the same manner as that of Example 24 was classified by elutriation to yield a fluorescent substance powder having an average particle diameter of 1.3 μm. This powder was added as a seed at 2 weight % in terms of the outer percentage to the composition of Example 24, and the same procedure as that of Example 24 was taken to synthesize a fluorescent substance except that the calcination temperature was set at 1900° C.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The emission intensity of this powder was standardized assuming that the emission intensity of Example 24 was 100, and the thus obtained value was 108.

Next, the compound was ground using an agate mortar, and was subjected to powder X-ray diffractometry using Cu—Kα radiation. As a result, it was found to consist of a single phase of α-sialon.

Example 142

A raw material powder having the same composition ratio as that of Example 34 was weighed out 100 g in total, and mixed with ethanol as a mixing solvent by using a wet ball mill for 2 hours, to thereby obtain a slurry having a viscosity of about 300 cps. As the mixing solvent, hexane or the like may also be used.

Subsequently, the obtained slurry was spray-dried by using a spray-dryer suitable for the organic solvent to thereby yield a granular mixed powder.

The obtained mixed powder was formed into a compact at a bulk density of about 24% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 1900° C. at a rate of 500° C./hour, and the temperature of 1900° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 11 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The emission intensity of this powder was standardized assuming that the emission intensity of Example 34 was 100, and the thus obtained value was 107.

Next, the compound was ground using an agate mortar, and was subjected to powder X-ray diffractometry using Cu—Kα radiation. As a result, it was found to consist of a single phase of α-sialon.

Example 143

The raw material powder used in Example 121 was formed into a compact at a bulk density of about 22% by using an aluminum mold, and was filled in a crucible made of boron nitride. The proportion of the compact volume to the crucible volume was set to about 80%. In the respective processes of weighing, mixing, and molding the powder, all operations were performed in air.

This boron nitride crucible filled with the mixed powder was set in an electric furnace of a lanthanum chromite resistance heating system which used an alumina fiber compact as a heat insulator. No carbon-containing material was used at all in the electric furnace chamber used in this Example. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 1900° C. at a rate of 500° C./hour, and the temperature of 1900° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 12 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The emission intensity of this powder was standardized assuming that the emission intensity of Example 121 was 100, and the thus obtained value was 82.

Next, the compound was ground using an agate mortar, and was subjected to powder X-ray diffractometry using Cu—Kα radiation. As a result, it was found to consist of a single phase of α-sialon.

Examples 144 to 153

A mixed powder having the same composition as that of Example 34 was filled in a crucible made of boron nitride at a bulk density and a filling rate shown in Table 29. In the respective processes of weighing, mixing, and molding the powder, all operations were performed in air.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of about 11 μm.

The powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The emission intensity of the powder was standardized assuming that the emission intensity of Example 34 was 100.

TABLE 29

|  | Bulk density % | Filling rate % | Emission intensity |
| --- | --- | --- | --- |
| Example 144 | 8 | 80 | 105 |
| Example 145 | 17 | 80 | 103 |
| Example 146 | 24 | 80 | 102 |
| Example 147 | 24 | 14 | 76 |
| Example 148 | 24 | 23 | 80 |
| Example 149 | 24 | 51 | 91 |
| Example 150 | 24 | 72 | 97 |
| Example 151 | 32 | 80 | 98 |
| Example 152 | 39 | 80 | 95 |
| Example 153 | 48 | 80 | 82 |

Examples 154 and 155

The fluorescent substance powder obtained in Example 142 was ground with ethanol as a solvent by using a ball mill consisting of the material shown in Table 30 to achieve an average particle diameter of 5 μm or less. The obtained slurry was evaporated to dryness. Then, the sample of Example 155 was washed with hydrochloric acid, evaporated to dryness again, and filled in a crucible made of boron nitride.

The boron nitride crucible filled with the sample was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of about 11 μm.

The powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The emission intensity of the powder was standardized assuming that the emission intensity of Example 142 was 100.

TABLE 30

|  | Grinder Ball, Lining material | Emission intensity |
| --- | --- | --- |
| Example 154 | Silicon nitride sintered body | 116.000 |
| Example 155 | Iron | 74.000 |

Examples 156 and 157

The fluorescent substance powder obtained in Example 142 was filled in a crucible made of boron nitride. The boron nitride crucible filled with the sample was set in a hot isostatic pressing apparatus of a graphite resistance heating system which used a carbon fiber compact as a heat insulator. Then, heating was carried out under either a condition having an atmospheric pressure of 30 MPa and a calcination temperature of 2100° C., or a condition having an atmospheric pressure of 50 MPa and a calcination temperature of 2200° C. The calcination atmosphere was a nitrogen atmosphere. After calcination, the obtained calcination product was subjected to coarse grinding and subsequent manual grinding using a mortar made of a silicon nitride sintered body, and then sifted through a 30 μm-sieve to yield a powder having an average particle diameter of about 11 μm.

The powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The emission intensity of the powder was standardized assuming that the emission intensity of Example 142 was 100.

TABLE 31

|  | Atmospheric pressure MPa | Calcination temperature ° C. | Emission intensity |
|---|---|---|---|
| Example 156 | 30 | 2100 | 111 |
| Example 157 | 50 | 2200 | 118 |

Example 158

5.0 g of the fluorescent substance powder obtained in Example 142 was dispersed well in a mixing solution having 1.0 g of tetraethoxysilane dissolved in 50 ml of isopropyl alcohol and 20 ml of distilled water. Into the dispersion solution, 50 ml of 15% ammonia aqueous solution was added dropwise under sufficient stirring. The mixture was then heated to reflux under stirring for 2 hours. The obtained slurry was filtrated, washed, dried, and calcinated in a nitrogen atmosphere at 600° C. for one hour to thereby yield an amorphous silica-coated fluorescent substance.

The obtained amorphous silica-coated fluorescent substance was observed with a transmission electron microscope. The thickness of the silica layer was about 70 nm. The emission intensity of this fluorescent substance was standardized assuming that the emission intensity of Example 142 was 100, and the thus obtained value was 114.

In addition, the silica layer obtained in the same manner as mentioned above was measured for the refractive index, which was shown to be 1.48.

The amount of oxygen in the amorphous silica-coated fluorescent substance obtained in Example 158 was larger than the amount of oxygen theoretically obtained from Example 142 by 0.2 mass %.

Example 159

32 ml of 0.1 M sodium hydroxide aqueous solution was added to 50 ml of 0.1 M boric acid 0.1 M potassium chloride aqueous solution, followed by dilution with distilled water up to 100 ml. In this aqueous solution, 5.0 g of the fluorescent substance powder obtained in Example 142 was charged, and dispersed well.

While keeping the pH of the slurry within the range of 9.0 to 10.5 using a sodium hydroxide aqueous solution, 10 ml of aluminum sulfate aqueous solution was added dropwise to thereby obtain fluorescent substance particles having fine particles of aluminum hydroxide adhered on the particle surfaces in the slurry. These fluorescent substance particles were washed, dried, and calcinated in air at 600° C. for two hours to thereby yield a fluorescent substance powder whose surfaces were coated with alumina layers.

The fluorescent substance particles were observed with a transmission electron microscope. The thickness of the alumina layer was about 50 nm.

The emission intensity of this fluorescent substance was standardized assuming that the emission intensity of Example 142 was 100, and the thus obtained value was 110.

In addition, the alumina layer obtained in the same manner as mentioned above was measured for the refractive index, which was shown to be 1.70.

The amount of oxygen in the alumina-coated fluorescent substance obtained in Example 159 was larger than the amount of oxygen theoretically obtained from Example 142 by 0.3 mass %.

Example 160

The calcination agglomerate of the fluorescent substance obtained by the same manner as that of Example 142 was lightly cracked using a mortar made of a silicon nitride sintered body. This calcination agglomerate was subjected to an acid treatment for 30 minutes under sufficient stirring with a mixed acid solution containing 48% concentration hydrofluoric acid, 36N sulfuric acid, and distilled water at a volume ratio of 5:5:390. Then, the fluorescent substance powder was isolated, washed, and dried to yield a treated powder.

The form of the particles was observed with a scanning electron microscope. Neither a grain boundary phase nor a vitreous second phase was observed, and the obtained product was found to consist of single crystal particles having automorphic surfaces.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The emission intensity of this powder was standardized assuming that the emission intensity of Example 142 was 100, and the thus obtained value was 116.

Examples 160 to 165 as for a light-emitting device using the fluorescent substance of the present invention are described below.

Example 161

Using the fluorescent substance of the present invention, a shell-type white light-emitting diode lamp 1 as shown in FIG. 1 was produced.

First, a blue light-emitting diode element 4 was bonded to an element-mounting recess 2a in the first lead wire 2 by using a conductive paste, to thereby electrically connect the first lead wire 2 and the lower electrode 4a of the blue light-emitting diode element 4 and to fix the blue light-emitting diode element 4.

Next, the upper electrode 4b of the blue light-emitting diode element 4 and the second lead wire 3 were electrically connected through wire-bonding using a bonding wire 5.

Then, an appropriate amount of a previously prepared fluorescent substance 7 was applied to the recess 2a so as to cover the blue light-emitting diode element 4 by a dispenser, and was then cured to thereby form a first resin 6.

Lastly, all over the apical end 2b of the first lead wire 2 including the recess 2a, the blue light-emitting diode element 4, and the first resin 6 having the fluorescent substance 7 dispersed therein were sealed in a second resin 8 by casting method.

The first resin 6 used herein was an epoxy resin having a refractive index of 1.6, and the second resin 8 used herein was an epoxy resin having a refractive index of 1.36.

In this Example, the fluorescent substance of Example 142 was mixed in the epoxy resin at a concentration of 30 weight %. An appropriate amount of this mixture was applied dropwise by using a dispenser to thereby form the first resin 6 where the fluorescent substance 7 having the fluorescent substance mixed therein was dispersed. The obtained LED lamp exhibited warm-white luminescence.

Example 162

Using the fluorescent substance of the present invention, a shell-type white light-emitting diode lamp 1 as shown in FIG. 1 was produced.

First, a blue light-emitting diode element 4 was bonded to an element-mounting recess 2a in the first lead wire 2 by using a conductive paste, to thereby electrically connect the first lead wire 2 and the lower electrode 4a of the blue light-emitting diode element 4 and to fix the blue light-emitting diode element 4.

Next, the upper electrode 4b of the blue light-emitting diode element 4 and the second lead wire 3 were electrically connected through wire-bonding using a bonding wire 5.

Then, an appropriate amount of a previously prepared fluorescent substance 7 was applied to the recess 2a so as to cover the blue light-emitting diode element 4 by a dispenser, and was then cured to thereby form a first resin 6.

Lastly, all over the apical end 2b of the first lead wire 2 including the recess 2a, the blue light-emitting diode element 4, and the first resin 6 having the fluorescent substance 7 dispersed therein were sealed in a second resin 8 by casting method.

The first resin 6 used herein was a silicone resin having a refractive index of 1.51, and the second resin 8 used herein was a silicone resin having a refractive index of 1.41.

In this Example, the fluorescent substance of Example 142 was mixed in the silicone resin at a concentration of 30 weight %. An appropriate amount of this mixture was applied dropwise by using a dispenser to thereby form the first resin 6 where the fluorescent substance 7 having the fluorescent substance mixed therein was dispersed. The obtained LED lamp exhibited warm-white luminescence.

Example 163

Using the fluorescent substance of the present invention, a shell-type white light-emitting diode lamp 1 as shown in FIG. 1 was produced.

First, a blue light-emitting diode element 4 was bonded to an element-mounting recess 2a in the first lead wire 2 by using a conductive paste, to thereby electrically connect the first lead wire 2 and the lower electrode 4a of the blue light-emitting diode element 4 and to fix the blue light-emitting diode element 4.

Next, the upper electrode 4b of the blue light-emitting diode element 4 and the second lead wire 3 were electrically connected through wire-bonding using a bonding wire 5.

Then, an appropriate amount of a previously prepared fluorescent substance 7 was applied to the recess 2a so as to cover the blue light-emitting diode element 4 by a dispenser, and was then cured to thereby form a first resin 6.

Lastly, all over the apical end 2b of the first lead wire 2 including the recess 2a, the blue light-emitting diode element 4, and the first resin 6 having the fluorescent substance 7 dispersed therein were sealed in a second resin 8 by casting method.

The first resin 6 used herein was a silicone resin having a refractive index of 1.51, and the second resin 8 used herein was a silicone resin having a refractive index of 1.41.

In this Example, the fluorescent substance of Example 158 was mixed in the silicone resin at a concentration of 30 weight %. An appropriate amount of this mixture was applied dropwise by using a dispenser to thereby form the first resin 6 where the fluorescent substance 7 having the fluorescent substance mixed therein was dispersed. The obtained LED lamp exhibited warm-white luminescence. In addition, the brightness was compared between the LED lamp of Example 160 and the LED lamp of this Example. The brightness of this Example was 110 assuming that the brightness of Example 160 was 100.

Example 164

Using the fluorescent substance of the present invention, a shell-type white light-emitting diode lamp 1 as shown in FIG. 1 was produced.

First, a blue light-emitting diode element 4 was bonded to an element-mounting recess 2a in the first lead wire 2 by using a conductive paste, to thereby electrically connect the first lead wire 2 and the lower electrode 4a of the blue light-emitting diode element 4 and to fix the blue light-emitting diode element 4.

Next, the upper electrode 4b of the blue light-emitting diode element 4 and the second lead wire 3 were electrically connected through wire-bonding using a bonding wire 5.

Then, an appropriate amount of a previously prepared fluorescent substance 7 was applied to the recess 2a so as to cover the blue light-emitting diode element 4 by a dispenser, and was then cured to thereby form a first resin 6.

Lastly, all over the apical end 2b of the first lead wire 2 including the recess 2a, the blue light-emitting diode element 4, and the first resin 6 having the fluorescent substance 7 dispersed therein were sealed in a second resin 8 by casting method.

The first resin 6 used herein was a silicone resin having a refractive index of 1.51, and the second resin 8 used herein was a silicone resin having a refractive index of 1.41.

In this Example, the fluorescent substance of Example 142, $CaSiAlN_3$:Eu, and $Ca_3Sc_2Si_3O_{12}$:Ce were mixed in the silicone resin at each concentration of 30 weight %. An appropriate amount of this mixture was applied dropwise by using a dispenser to thereby form the first resin 6 where the fluorescent substance 7 having the fluorescent substance mixed therein was dispersed.

The obtained LED lamp showed a color-rendering property of 123 assuming that the color-rendering property of Example 161 was 100.

Example 165

Next, in respect to the shell-type white light-emitting diode lamp 1 as shown in FIG. 1, a light-emitting device having a different configuration as those of Examples 160 to 163 was produced.

The structure was such that an ultraviolet light emitting-element of 380 nm was used as the light emitting-element instead of the blue light emitting-element; the fluorescent substance of Example 142 and a blue fluorescent substance (BaMgAl$_{10}$O$_{17}$:Eu) were dispersed in a resin layer made of a silicone resin, and the resin was covered over the ultraviolet LED.

It was confirmed that, when an electrical current was applied to the conductive terminus, the LED emitted ultraviolet light of 380 nm, these colors of light were mixed, and thereby the lamp functioned as a white light-emitting device.

Example 166

Furthermore, a surface-mount chip-type white light-emitting diode lamp 11 as shown in FIG. 2 was produced. The reference symbol 14a denotes a lower electrode. Onto the lower electrode, a light-emitting diode 4 and an upper electrode 14b are connected by a bonding wire 5.

The production procedure was almost the same as that of Example 10, except that third lead wires 12, 12a, and 12b, fourth lead wires 13, 13a, and 13b, and a side wall member 20 were fixed to an alumina ceramic substrate 19.

In this Example, the side wall members 20, 20a, and 20b were made of a white silicone resin, and the third resin 16 and the fourth resin 18 were made of a same epoxy resin.

The fluorescent substance of Example 142 was used for the fluorescent substance 17, and was confirmed to exhibit warm white luminescence.

Example 167

As for the raw material powder, a silicon nitride powder having an average particle diameter of 0.5 μm, an oxygen content of 0.93 weight %, and an α-type content of 92%, an aluminum nitride powder, a strontium silicon nitride powder (SrSiN$_2$), and an europium silicon nitride powder (EuSi$_6$N$_8$) were used.

In order to obtain a compound represented by the general formula Sr$_x$M(1)$_y$M(2)$_z$Si$_{12-(m+n)}$Al$_{(m+n)}$O$_n$N$_{16-n}$ where x=0.360, y=0.015, z=0, m=0.75, and n=0, 0.110 g of the europium silicon nitride powder, 0.871 g of the strontium silicon nitride powder, 0.518 g of the aluminum nitride powder, and 8.501 g of the silicon nitride powder were weighed and mixed using an agate pestle and mortar for 30 minutes. In this case, M(1) was Eu.

The obtained mixed powder was formed into a compact at a bulk density of about 24% by using an aluminum mold, and was filled in a crucible made of boron nitride. The proportion of the compact volume to the crucible volume was set to about 80%.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 11 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensity was 106 counts. The count rate had an arbitrary unit as it varied depending on the measuring equipment and conditions.

In respect to this fluorescent substance, the obtained powder X-ray diffraction pattern was similar to that of Example 3.

In addition, this fluorescent substance was exposed to an 80% humidity and 80° C. temperature condition for 100 hours, by which almost no reduction in the brightness was seen.

Example 168

As for the raw material powder, a silicon nitride powder having an average particle diameter of 0.5 μm, an oxygen content of 0.93 weight %, and an α-type content of 92%, an aluminum nitride powder, a strontium silicon nitride powder (SrSi$_6$N$_8$), and an europium silicon nitride powder (EuSi$_6$N$_8$) were used.

In order to obtain a compound represented by the general formula Sr$_x$M(1)$_y$M(2)$_z$Si$_{12-(m+n)}$Al$_{(m+n)}$O$_n$N$_{16-n}$ where x=0.360, y=0.015, z=0, m=0.75, and n=0, 0.099 g of the europium silicon nitride powder, 2.015 g of the strontium silicon nitride powder, 0.467 g of the aluminum nitride powder, and 7.419 g of the silicon nitride powder were weighed and mixed using an agate pestle and mortar for 30 minutes. In this case, M(1) was Eu.

The obtained mixed powder was formed into a compact at a bulk density of about 26% by using an aluminum mold, and was filled in a crucible made of boron nitride. The proportion of the compact volume to the crucible volume was set to about 80%.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 13 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensity was 110 counts. The count rate had an arbitrary unit as it varied depending on the measuring equipment and conditions.

In respect to this fluorescent substance, the obtained powder X-ray diffraction pattern was similar to that of Example 3.

In addition, this fluorescent substance was exposed to an 80% humidity and 80° C. temperature condition for 100 hours, by which almost no reduction in the brightness was seen.

Example 169

As for the raw material powder, a silicon nitride powder having an average particle diameter of 0.5 μm, an oxygen content of 0.93 weight %, and an α-type content of 92%, an aluminum nitride powder, a strontium nitride powder, a lanthanum nitride powder, and an europium oxide powder were used.

In order to obtain a compound represented by the general formula $M(0)_xM(1)_yM(2)_zSi_{12-(m+n)}Al_{(m+n)}O_nN_{16-n}$ where x=0.285, y=0.015, z=0, m=0.75, and n=0.015, 0.044 g of the europium oxide powder, 0.22 g of the strontium nitride powder, 0.385 g of the lanthanum nitride powder, 0.527 g of the aluminum nitride powder, and 8.824 g of the silicon nitride powder were weighed and mixed using an agate pestle and mortar for 30 minutes. In this case, M(0) was Sr or La where the atomic ratio of Sr and La was Sr:La=0.135:0.15, and M(1) was Eu.

The obtained mixed powder was formed into a compact at a bulk density of about 28% by using an aluminum mold, and was filled in a crucible made of boron nitride. The proportion of the compact volume to the crucible volume was set to about 80%. In the respective processes of weighing, mixing, and molding the powder, all operations were performed in a glove box capable of keeping a nitrogen atmosphere at 1 ppm or less of moisture and 1 ppm or less of oxygen.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 12 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensity was 108 counts. The count rate had an arbitrary unit as it varied depending on the measuring equipment and conditions.

In respect to this fluorescent substance, the obtained powder X-ray diffraction pattern was similar to that of Example 112.

In addition, this fluorescent substance was exposed to an 80% humidity and 80° C. temperature condition for 100 hours, by which almost no reduction in the brightness was seen.

Example 170

As for the raw material powder, a silicon nitride powder having an average particle diameter of 0.5 μm, an oxygen content of 0.93 weight %, and an α-type content of 92%, an aluminum nitride powder, a lanthanum nitride powder, and an europium oxide powder were used.

In order to obtain a compound represented by the general formula $La_xM(1)_yM(2)_zSi_{12-(m+n)}Al_{(m+n)}O_nN_{16-n}$ where x=0.24, y=0.015, z=0, m=0.75, and n=0.015, 0.044 g of the europium oxide powder, 0.616 g of the lanthanum nitride powder, 0.526 g of the aluminum nitride powder, and 8.814 g of the silicon nitride powder were weighed and mixed using an agate pestle and mortar for 30 minutes. In this case, M(1) was Eu.

The obtained mixed powder was formed into a compact at a bulk density of about 26% by using an aluminum mold, and was filled in a crucible made of boron nitride. The proportion of the compact volume to the crucible volume was set to about 80%. In the respective processes of weighing, mixing, and molding the powder, all operations were performed in a glove box capable of keeping a nitrogen atmosphere at 1 ppm or less of moisture and 1 ppm or less of oxygen.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 14 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensity was 106 counts. The count rate had an arbitrary unit as it varied depending on the measuring equipment and conditions.

In respect to this fluorescent substance, the obtained powder X-ray diffraction pattern was similar to that of Example 112.

In addition, this fluorescent substance was exposed to an 80% humidity and 80° C. temperature condition for 100 hours, by which almost no reduction in the brightness was seen.

Example 171

As for the raw material powder, a silicon nitride powder having an average particle diameter of 0.5 μm, an oxygen content of 0.93 weight %, and an α-type content of 92%, an aluminum nitride powder, a lanthanum nitride powder, and a cerium oxide powder were used.

In order to obtain a compound represented by the general formula $La_xM(1)_yM(2)_zSi_{12-(m+n)}Al_{(m+n)}O_nN_{16-n}$ where x=0.235, y=0.015, z=0, m=0.75, and n=0.0225, 0.043 g of the cerium oxide powder, 0.604 g of the lanthanum nitride powder, 0.532 g of the aluminum nitride powder, and 8.821 g of the silicon nitride powder were weighed and mixed using an agate pestle and mortar for 30 minutes. In this case, M(1) was Ce.

The obtained mixed powder was formed into a compact at a bulk density of about 24% by using an aluminum mold, and was filled in a crucible made of boron nitride. The proportion of the compact volume to the crucible volume was set to about 80%. In the respective processes of weighing, mixing, and molding the powder, all operations were performed in a glove box capable of keeping a nitrogen atmosphere at 1 ppm or less of moisture and 1 ppm or less of oxygen.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 11 μm.

This powder was irradiated with light having a wavelength of 365 nm by an ultraviolet lamp, as a result of which white-blue light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 375 nm, and a peak at white-blue light of 490 nm.

The peak emission intensity was 107 counts. The count rate had an arbitrary unit as it varied depending on the measuring equipment and conditions.

In respect to this fluorescent substance, the obtained powder X-ray diffraction pattern was similar to that of Example 112.

In addition, this fluorescent substance was exposed to an 80% humidity and 80° C. temperature condition for 100 hours, by which almost no reduction in the brightness was seen.

Example 172

As for the raw material powder, a silicon nitride powder having an average particle diameter of 0.5 μm, an oxygen content of 0.93 weight %, and an α-type content of 92%, an aluminum nitride powder, a calcium nitride powder, a lanthanum nitride powder, and an europium oxide powder were used.

In order to obtain a compound represented by the general formula $La_xM(1)_yM(2)_zSi_{12-(m+n)}Al_{(m+n)}O_nN_{16-n}$ where x=0.285, y=0.015, z=0, m=0.75, and n=0.015, 0.045 g of the europium oxide powder, 0.113 g of the calcium nitride powder, 0.390 g of the lanthanum nitride powder, 0.533 g of the aluminum nitride powder, and 8.920 g of the silicon nitride powder were weighed and mixed using an agate pestle and mortar for 30 minutes. In this case, M(1) was Eu and M(2) was Ca.

The obtained mixed powder was formed into a compact at a bulk density of about 25% by using an aluminum mold, and was filled in a crucible made of boron nitride. The proportion of the compact volume to the crucible volume was set to about 80%. In the respective processes of weighing, mixing, and molding the powder, all operations were performed in a glove box capable of keeping a nitrogen atmosphere at 1 ppm or less of moisture and 1 ppm or less of oxygen.

This boron nitride crucible filled with the mixed powder was set in an electric furnace of a graphite resistance heating system which used a carbon fiber compact as a heat insulator. The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 13 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensity was 104 counts. The count rate had an arbitrary unit as it varied depending on the measuring equipment and conditions.

In respect to this fluorescent substance, the obtained powder X-ray diffraction pattern was similar to that of Example 112.

In addition, this fluorescent substance was exposed to an 80% humidity and 80° C. temperature condition for 100 hours, by which almost no reduction in the brightness was seen.

Example 173

As for the raw material powder, a silicon nitride powder having an average particle diameter of 0.5 μm, an oxygen content of 0.93 weight %, and an α-type content of 92%, an aluminum nitride powder, a strontium nitride powder, a calcium nitride powder, a lanthanum nitride powder, and an europium oxide powder were used.

In order to obtain a compound represented by the general formula $M(0)_xM(1)_yM(2)_zSi_{12-(m+n)}Al_{(m+n)}O_nN_{16-n}$ where x=0.208, y=0.015, z=011, m=0.75, and n=0.015, 0.045 g of the europium oxide powder, 0.092 g of the calcium nitride powder, 0.206 g of the strontium nitride powder, 0.216 g of the lanthanum nitride powder, 0.532 g of the aluminum nitride powder, and 8.91 g of the silicon nitride powder were weighed and mixed using an agate pestle and mortar for 30 minutes. In this case, M(0) was Sr or La where the atomic ratio of Sr and La was Sr:La=0.125:0.083, M(1) was Eu, and M(2) was Ca.

The obtained mixed powder was formed into a compact at a bulk density of about 26% by using an aluminum mold, and was filled in a crucible made of boron nitride. The proportion of the compact volume to the crucible volume was set to about 80%. In the respective processes of weighing, mixing, and molding the powder, all operations were performed in a glove box capable of keeping a nitrogen atmosphere at 1 ppm or less of moisture and 1 ppm or less of oxygen.

This boron nitride crucible filled with the mixed powder was set in an electric furnace of a graphite resistance heating system which used a carbon fiber compact as a heat insulator.

The calcination operation was carried out by the following manner. First, the calcination atmosphere was vacuated using a diffusion pump, and then heated from room temperature to 1000° C. at a rate of 500° C./hour. At 1000° C., nitrogen at a purity of 99.999 volume % was introduced therein to set the pressure at 0.9 MPa. The temperature was raised to 2000° C. at a rate of 500° C./hour, and the temperature of 2000° C. was kept for 2 hours. After calcination, the obtained calcination product was subjected to coarse grinding and subsequent manual grinding using a mortar made of a silicon nitride sintered body, and then sifted through a 30 μm-sieve to yield a powder having an average particle diameter of 11 μm.

This powder was irradiated with light having a wavelength of 365 nm by using an ultraviolet lamp, as a result of which yellow light emission was confirmed. The emission spectrum and the excitation spectrum of this powder were measured using a fluorescence spectrophotometer. As a result, regarding the peak wavelengths of the excitation and emission spectra, the powder was found to be a fluorescent substance having an excitation spectrum peak at 400 nm, and an emission spectrum peak at yellow light of 580 nm by excitation with blue light of 450 nm. The peak emission intensity was 109 counts. The count rate had an arbitrary unit as it varied depending on the measuring equipment and conditions.

In respect to this fluorescent substance, the obtained powder X-ray diffraction pattern was similar to that of Example 112.

In addition, this fluorescent substance was exposed to an 80% humidity and 80° C. temperature condition for 100 hours, by which almost no reduction in the brightness was seen.

INDUSTRIAL APPLICABILITY

The fluorescent substance of the present invention has higher emission intensity than those of conventional sialon and oxynitride fluorescent substances, is superior as a fluorescent substance, and furthermore has less reduction in the brightness of the fluorescent substance when exposed to an excitation source. Therefore, the fluorescent substance of the present invention is a nitride fluorescent substance which can be suitably used for a white LED, an inorganic EL, an organic EL, and the like. In the future, the fluorescent substance of the present invention can be expected to be greatly applied to the material design of various light-emitting devices such as an illumination device and a display device, and to contribute to the development of the industry.

The invention claimed is:

1. A fluorescent substance comprising an α-sialon crystal structure having the same crystal structure with an α-type silicon nitride crystal, which has a peak emission wavelength within the range of 560 to 610 nm and includes a composition represented by the following composition formula:

$$M(0)_xM(1)_yM(2)_zSi_{12-(m+n)}Al_{(m+n)}O_nN_{16-n}$$

where M(0) represents one or two elements selected from Sr and La;
M(1) represents one or more elements selected from Mn, Ce, Pr, Nd, Sm, Eu, Tb, Dy, Ho, Er, Tm, and Yb;
M(2) represents one or more elements selected from Li, Na, Be, Mg, Ca, Ba, Sc, Y, Gd, and Lu;
x, y, and z represent the composition ratio satisfy the inequations of $0.01 \leq x \leq 4$, $0.001 < y \leq 2$, $0 \leq z \leq 2$, and $0 \leq z/x \leq 2/3$; and
m and n represent the composition ratio satisfy the inequations of $0.8 \cdot me \leq m \leq 1.2 \cdot me$ and $0 \leq n \leq 4$ provided that $me = x \cdot v(0) + y \cdot v(1) + z \cdot v(2)$ (where $v(0)$ represents a valence of the M(0) ion, $v(1)$ represents a valence of the M(1) ion, and $v(2)$ represents a valence of the M(2) ion).

2. A fluorescent substance comprising an α-sialon crystal structure having the same crystal structure with an α-type silicon nitride crystal, which has a peak emission wavelength within the range of 560 to 610 nm and includes a composition represented by the following composition formula:

$$M(0)_xM(1)_yM(2)_zSi_{12-(m+n)}Al_{(m+n)}O_nN_{16-n}$$

where M(0) represents one or two elements selected from Sr and La;
M(1) represents one or more elements selected from Mn, Ce, Pr, Nd, Sm, Eu, Tb, Dy, Ho, Er, Tm, and Yb;
M(2) represents one or more elements selected from Li, Na, Be, Mg, Ca, Ba, Sc, Y, Gd, and Lu;
x, y, and z represent the composition ratio satisfy the inequations of $0.01 \leq x \leq 4$, $0.001 < y \leq 2$, $0 \leq z \leq 2$, and $0 \leq z/x \leq 2/3$; and
m and n represent the composition ratio satisfy the inequations of $0.8 \cdot me \leq m \leq 1.2 \cdot me$ and $0 \leq n \leq 4$ provided that $me = x \cdot v(0) + y \cdot v(1) + z \cdot v(2)$ (where $v(0)$ represents a valence of the M(0) ion, $v(1)$ represents a valence of the M(1) ion, and $v(2)$ represents a valence of the M(2) ion), wherein
the fluorescent substance comprises an α-sialon powder having the α-sialon crystal structure, and an amount of oxygen included in the α-sialon powder is larger than the value calculated on the basis of the above composition formula, by a difference within the range of 0.4 mass % or less.

3. A method for producing a fluorescent substance of claim 1 comprising:
using at least one or more raw materials selected from $MSiN_2$, $M_2Si_5N_8$, $M_3Al_2N_4$, and $MSi_6N_8$ as a starting material, in the form of an M-containing compound (where M represents one or more elements selected from divalent elements in the element group consisting of Sr and M(1)).

4. A method for producing a fluorescent substance of claim 1 comprising:
a process of preparing one or more raw materials selected from $MSiN_2$, $M_2Si_5N_8$, $M_3Al_2N_4$, and $MSi_6N_8$ as a starting material, in the form of an M-containing compound (where M represents one or more elements selected from divalent elements in the element group consisting of Sr and M(1));
a process of kneading the raw materials to yield a raw material mixture;
a process of forming a compact of the raw material mixture;
a process of calcinating the compact; and
a process of heat-treating the calcinated compact.

5. The method for producing a fluorescent substance according to claim 3, wherein $LiSi_2N_3$ is used as a starting material in the form of an Li-containing compound, for further including an M(2) element (where M(2) represents one or more elements selected from Li, Na, Be, Mg, Ca, Ba, Sc, Y, Gd, and Lu).

6. The method for producing a fluorescent substance according to claim 4, wherein a fluorescent substance powder having a target composition previously synthesized as a seed, is added to said raw material mixture.

7. A fluorescent substance comprising a transparent layer in a thickness of (10 to 180)/n (unit: nanometer) on at least a part of the surfaces of α-sialon particles constituting the fluorescent substance according to claim 1, provided that n represents a refractive index of the transparent layer within the range of 1.2 to 2.5.

8. A method for producing a fluorescent substance comprising:
suspending a fluorescent substance of claim 1 in an organic solvent; and
adding an organometallic complex or metalalkoxide dropwise thereto, to thereby form a transparent layer in a thickness of (10 to 180)/n (unit: nanometer) on at least a part of the surfaces of α-sialon particles, provided that n represents a refractive index of the transparent layer within the range of 1.2 to 2.5.

9. A method for producing a fluorescent substance comprising:
suspending a fluorescent substance of claim 1 in water; and
adding a metal salt aqueous solution dropwise thereto while keeping a constant pH, to thereby form a transparent layer in a thickness of (10 to 180)/n (unit: nanometer) on at least a part of the surfaces of α-sialon particles, provided that n represents a refractive index of the transparent layer within the range of 1.2 to 2.5.

10. A light-emitting device comprising a light emitting light source and a fluorescent substance, wherein the fluorescent substance according to claim 1 is used.

11. A light-emitting device comprising a light emitting light source and a fluorescent substance, wherein the fluorescent substance according to claim 1 and $CaAlSiN_3$:Eu are used.

12. A light-emitting device comprising a light emitting light source and a fluorescent substance, wherein the fluorescent substance according to claim 7 is used.

13. A light-emitting device comprising a light emitting light source and a fluorescent substance, wherein the fluorescent substance according to claim 7 and $CaAlSiN_3$:Eu are used.

* * * * *